(12) United States Patent
Wang et al.

(10) Patent No.: US 11,322,470 B2
(45) Date of Patent: May 3, 2022

(54) OPTICAL SEMICONDUCTOR PACKAGE AND METHOD FOR MANUFACTURING THE SAME

(71) Applicant: TAIWAN SEMICONDUCTOR MANUFACTURING COMPANY LTD., Hsinchu (TW)

(72) Inventors: Chuei-Tang Wang, Taichung (TW); Chih-Chieh Chang, Hsinchu (TW); Yu-Kuang Liao, Hsinchu (TW); Hsing-Kuo Hsia, Hsinchu County (TW); Chih-Yuan Chang, Hsinchu (TW); Jeng-Shien Hsieh, Kaohsiung (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/879,556

(22) Filed: May 20, 2020

(65) Prior Publication Data
US 2020/0286845 A1 Sep. 10, 2020

Related U.S. Application Data

(62) Division of application No. 15/796,091, filed on Oct. 27, 2017, now Pat. No. 10,665,560.

(51) Int. Cl.
*H01L 23/00* (2006.01)
*H01L 21/304* (2006.01)
(Continued)

(52) U.S. Cl.
CPC ............ *H01L 24/17* (2013.01); *H01L 21/304* (2013.01); *H01L 21/30604* (2013.01);
(Continued)

(58) Field of Classification Search
CPC ..... H01L 24/17; H01L 25/00; H01L 23/3128; H01L 21/6835; H01L 21/304; H01L 21/30604; H01L 21/44; H01L 23/3107; H01L 23/5226; H01L 24/03; H01L 24/09; H01L 24/11; H01L 23/49811; H01L 24/73; H01L 2224/92125; H01L 2224/16227;
(Continued)

(56) References Cited

U.S. PATENT DOCUMENTS

2007/0080458 A1* 4/2007 Ogawa ................ H01L 21/6835
257/750
2014/0269804 A1* 9/2014 Lai ........................ G02B 6/4206
372/50.21
(Continued)

*Primary Examiner* — Mohammad M Hoque
(74) *Attorney, Agent, or Firm* — WPAT, P.C. Intellectual Property Attorneys; Anthony King

(57) ABSTRACT

A semiconductor package includes an interconnect structure having a first surface and a second surface opposite to the first surface, an insulating layer contacting the second surface of the interconnect structure wherein the insulating layer has a third surface facing the second surface of the interconnect structure and a fourth surface opposite to the third surface, at least one optical chip over the fourth surface of the insulating layer and electrically coupled to the interconnect structure, and a molding compound over the first surface of the interconnect structure.

20 Claims, 28 Drawing Sheets

(51) Int. Cl.
*H01L 21/306* (2006.01)
*H01L 21/44* (2006.01)
*H01L 23/31* (2006.01)
*H01L 23/522* (2006.01)
*H01L 23/498* (2006.01)
*H01L 25/00* (2006.01)
*H01L 21/683* (2006.01)

(52) U.S. Cl.
CPC .......... *H01L 21/44* (2013.01); *H01L 21/6835* (2013.01); *H01L 23/3107* (2013.01); *H01L 23/3128* (2013.01); *H01L 23/49811* (2013.01); *H01L 23/5226* (2013.01); *H01L 24/03* (2013.01); *H01L 24/09* (2013.01); *H01L 24/11* (2013.01); *H01L 25/00* (2013.01); *H01L 24/16* (2013.01); *H01L 24/32* (2013.01); *H01L 24/73* (2013.01); *H01L 24/81* (2013.01); *H01L 24/92* (2013.01); *H01L 2221/6834* (2013.01); *H01L 2221/68327* (2013.01); *H01L 2224/16227* (2013.01); *H01L 2224/32225* (2013.01); *H01L 2224/73204* (2013.01); *H01L 2224/81005* (2013.01); *H01L 2224/92125* (2013.01); *H01L 2225/06517* (2013.01); *H01L 2225/06534* (2013.01); *H01L 2225/06572* (2013.01); *H01L 2924/15311* (2013.01)

(58) Field of Classification Search
CPC .......... H01L 2224/73204; H01L 24/92; H01L 24/32; H01L 2221/6834; H01L 2221/68327; H01L 2225/06572; H01L 24/16; H01L 2924/15311; H01L 2225/06534; H01L 2224/32225; H01L 2224/81005; H01L 2225/06517; H01L 24/81; H01L 25/167
USPC ........................................... 257/698
See application file for complete search history.

(56) References Cited

U.S. PATENT DOCUMENTS

| | | | |
|---|---|---|---|
| 2014/0269805 A1* | 9/2014 | Lai | H01S 5/026 372/50.23 |
| 2015/0041980 A1* | 2/2015 | Ahn | H01L 24/97 257/738 |
| 2017/0150875 A1* | 6/2017 | Shimizu | H01L 27/14 |
| 2019/0006249 A1* | 1/2019 | Pedersen | H01L 24/06 |

* cited by examiner

OPTICAL SEMICONDUCTOR PACKAGE AND METHOD FOR MANUFACTURING THE SAME

PRIORITY CLAIM AND CROSS-REFERENCE

This patent is a divisional application of U.S. patent application Ser. No. 15/796,091 filed on Oct. 27, 2017, entitled of "OPTICAL SEMICONDUCTOR PACKAGE AND METHOD FOR MANUFACTURING THE SAME", which is incorporated by reference in its entirety.

BACKGROUND

The demands of advanced electronic technology require electronic products to be made lighter, thinner, faster and smarter while simultaneously making them more friendly, powerful, reliable, robust and less expensive. Therefore, the trend for electronic packages is to develop highly-integrated packaging structures. The multi-chip module (MCM) package can integrate the chips having different functions, such as microprocessors, memories, logic elements, optical ICs and capacitors, and replaces the prior art of disposing individual packages on one circuit board. Therefore, the packaging size is decreased and the reliability of the memory device is improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
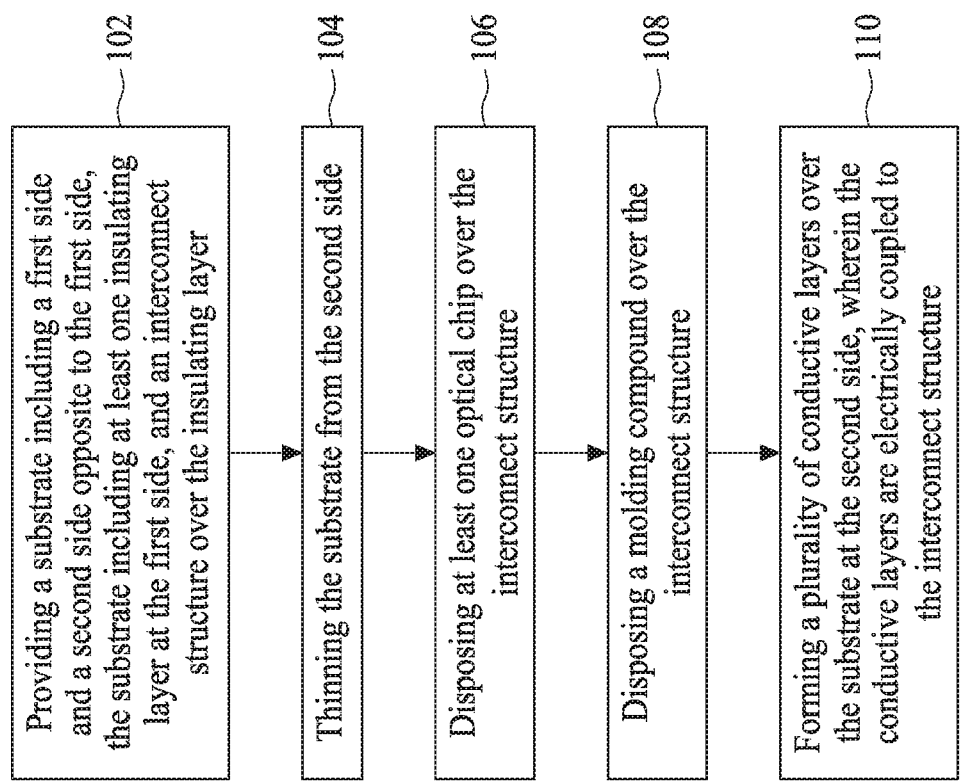
FIG. 1 is a flow chart representing a method for manufacturing a semiconductor package in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first". "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±50, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In one embodiment, a silicon photonic transceiver includes optoelectronic transceivers and optical source that enable communication of optical signals vertically to and from the surface of a photonic bench, which usually includes an interconnection structure, a silicon interposer, and through-substrate vias (referred to herein as TSVs) formed in the interposer. As known in the art, TSVs, which are also commonly referred to as through-silicon vias in the case of silicon substrates/wafer, are vertical electrical connections that extend the full thickness of the bulk silicon interposer from one side to another. However, the silicon interposer including TSVs suffers high cost and lower throughput because fabricating the interposer with TSVs is a complex process. Furthermore, the silicon photonic transceiver suffers electric loss due to the long TSV signal path. Additionally, optical loss exists as light prone to propagate into bulk silicon at the bottom of interposer.

Furthermore, it is found that the optical elements such as Laser chips, couplers and fibers are all mounted on the molding compound of the package. Thus, a silicon spacer embedded in the molding compound thereby allowing lights passing through is required. Consequently, the package may suffer from the increased optical path due to this arrangement. More importantly, the photonic package is not a flat package, which is less suitable for subsequent manufacturing operations.

One or more implementations of the present disclosure will now be described with reference to the attached drawings, wherein like reference numerals are used to refer to like elements throughout, and wherein the illustrated structures are not necessarily drawn to scale. As used herein, the terms "die" and "chip" are interchangeable throughout the specification.

The terms "wafer" and "substrate" used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

The term "patterning" or "patterned" is used in the present disclosure to describe an operation of forming a predetermined pattern on a surface. The patterning operation includes various steps and processes and varies in accordance with the features of embodiments. In some embodiments, a patterning operation is adopted to pattern an existing film or layer. The patterning operation includes forming a mask on the existing film or layer and removing the unmasked film or layer with an etch or other removal process. The mask is a photo resist, or a hard mask. In some embodiments, a patterning operation is adopted to form a patterned layer directly on a surface. The patterning operation includes forming a photosensitive film on the surface, conducting a photolithography process and a developing process. The remaining photosensitive film is retained and integrated into the semiconductor device.

Figure 2:
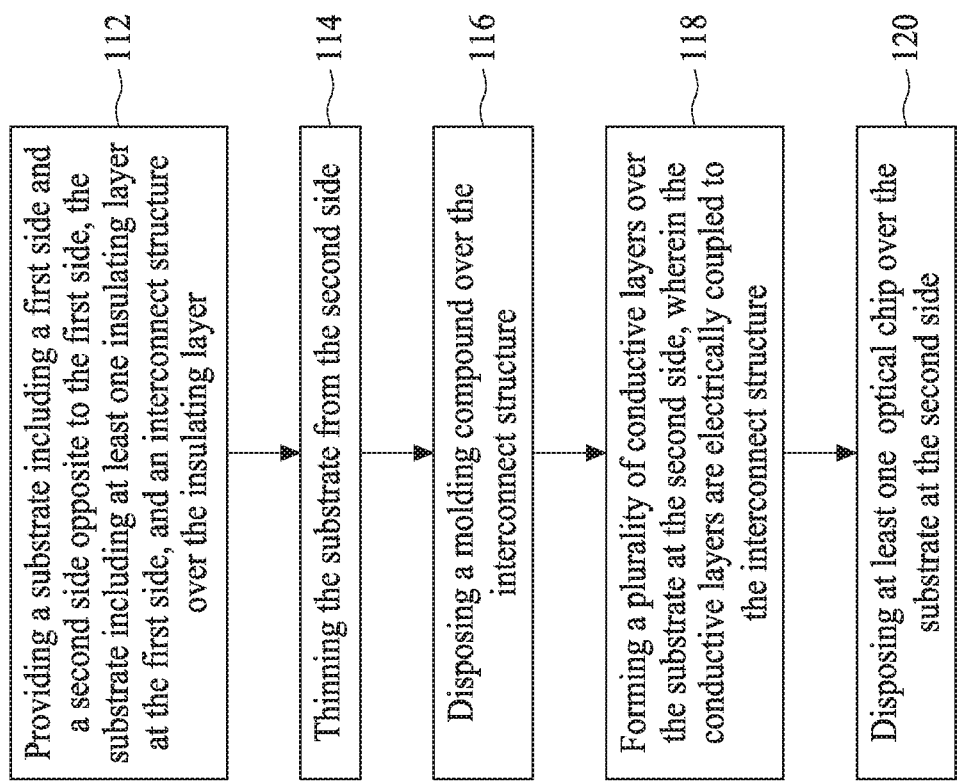
FIG. 2 is a flow chart representing a method for manufacturing a semiconductor package in accordance with some embodiments of the present disclosure.

FIG. 1 is a flow chart representing a method for manufacturing a semiconductor package 10 in accordance with some embodiments of the present disclosure. The method for manufacturing the semiconductor package 10 includes an Operation 102: Providing a substrate including a first side and a second side opposite to the first side, the substrate including at least one insulating layer at the first side, and an interconnect structure being formed over the insulating layer, an Operation 104: Thinning the substrate from the second side, an Operation 106: Disposing at least one optical chip over interconnect structure, an Operation 108: Disposing a molding compound over the interconnect structure, and an Operation 110: Forming a plurality of conductive layers over the substrate at the second side, wherein the conductive layers are electrically coupled to the interconnect structure. The method for manufacturing the semiconductor package 10 will be further described according to one or more embodiments. FIG. 2 is a flow chart representing a method for manufacturing a semiconductor package 11 in accordance with some embodiments of the present disclosure. The method for manufacturing the semiconductor package 11 includes an Operation 112: Providing a substrate including a first side and a second side opposite to the first side, the substrate including at least one insulating layer at the first side, and an interconnect structure being formed over the insulating layer, an Operation 114: Thinning the substrate from the second side, an Operation 116: Disposing a molding compound over the interconnect structure, an Operation 118: Forming a plurality of conductive layers over the substrate at the second side, the conductive layers are electrically coupled to the interconnect structure, and an Operation 120: Disposing at least one optical chip over the substrate at the second side. The method for forming the semiconductor package 11 will be further described according to one or more embodiments.

Figure 3:
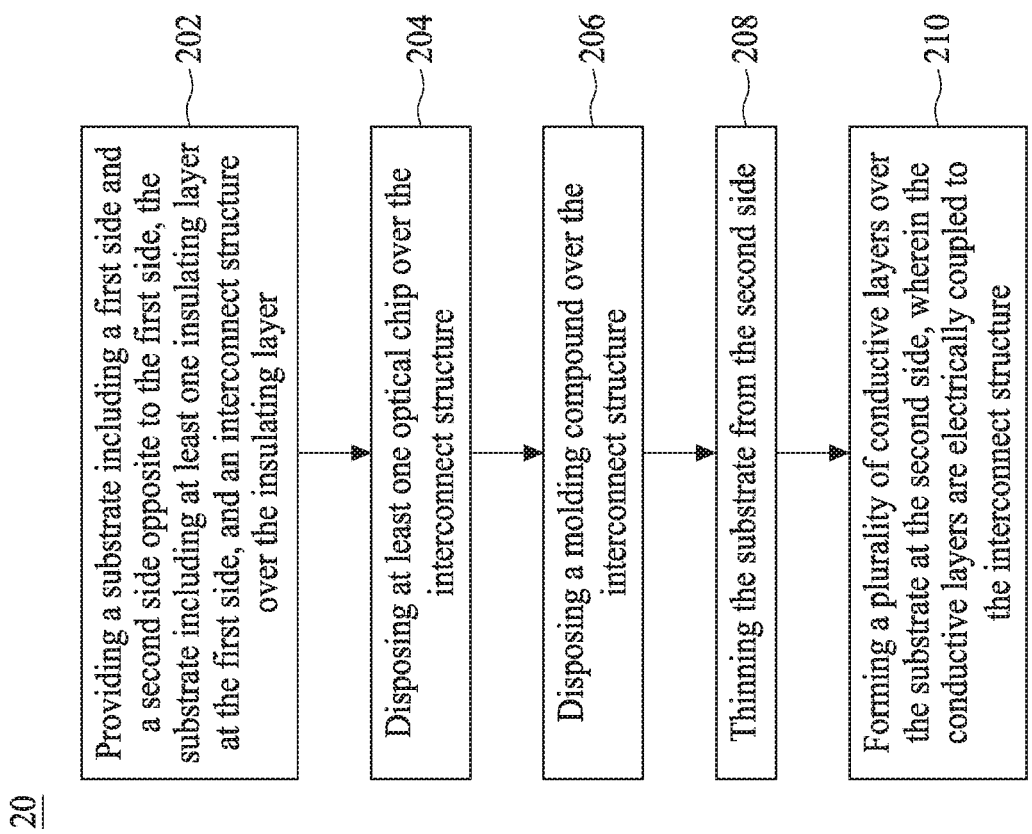
FIG. 3 is a flow chart representing a method for manufacturing a semiconductor package in accordance with some embodiments of the present disclosure.

FIG. 3 is a flow chart representing a method for manufacturing a semiconductor package 20 in accordance with some embodiments of the present disclosure. The method for manufacturing the semiconductor package 20 includes an Operation 202: Providing a substrate including a first side and a second side opposite to the first side, the substrate including at least one insulating layer at the first side, and an interconnect structure being formed over the insulating layer, an Operation 204: Disposing at least one optical chip over interconnect structure, an Operation 206: Disposing a molding compound over the interconnect structure, an Operation 208: Thinning the substrate from the second side, and an Operation 210: Forming a plurality of conductive layers over the substrate at the second side, the conductive layers are electrically coupled to the interconnect structure. The method for manufacturing the semiconductor package 20 will be further described according to one or more embodiments.

FIGS. 4A through 4M illustrate sectional views of a semiconductor package 30 at various fabrication stages constructed according to aspects of the present disclosure in some embodiments.

Figure 4A:
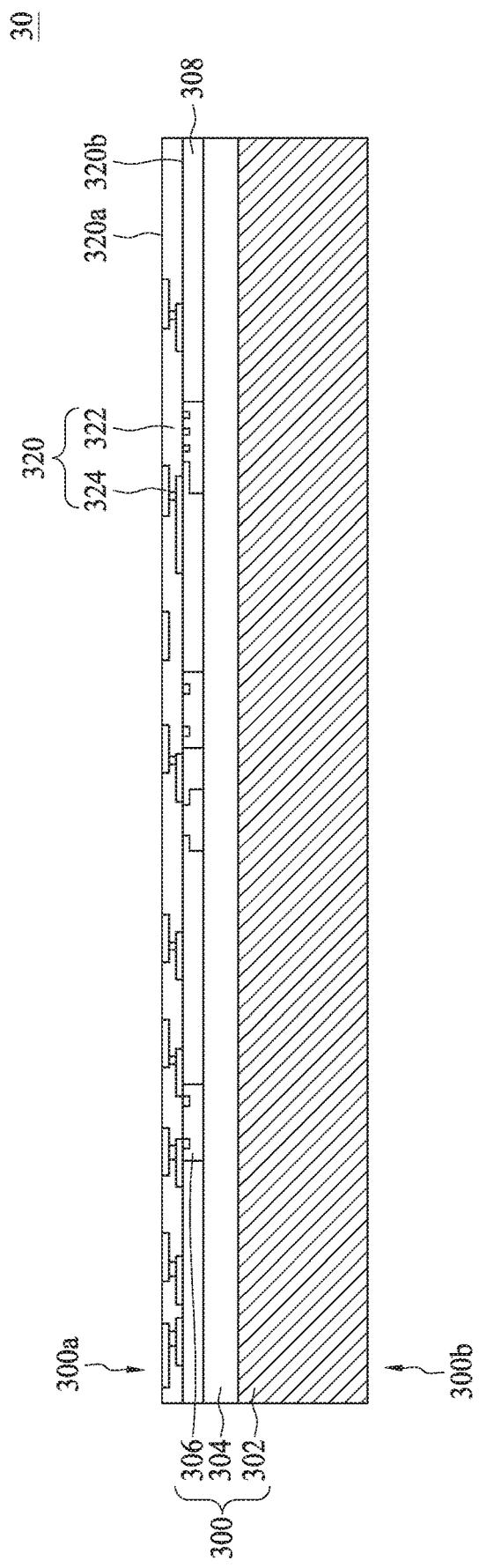
FIGS. 4A through 4M illustrate sectional views of a semiconductor package at various fabrication stages constructed according to aspects of the present disclosure in one or more embodiments.

Referring to FIG. 4A, a substrate 300 is provided according to Operation 102. The substrate 300 includes a first side 300a and a second side 300b opposite to the first side 300a.

In some embodiments of the present disclosure, the substrate 300 may include a silicon substrate although other semiconductor substrates, such as silicon-germanium substrate or III-V compound substrate may be utilized in various embodiments. In some embodiments of the present disclosure, the substrate 300 includes a silicon on insulator (SOI) substrate. In some embodiments of the present disclosure, the substrate 300 includes a semiconductor layer 306 formed on an insulator layer 304 at the first side 300*a*, and the semiconductor layer 306 can include, for example but not limited to, silicon. The insulator layer 304 may be, for example, a buried oxide (BOX) layer or a silicon oxide layer. The insulator layer 304 is provided on a bulk structure 302, typically a silicon or glass substrate. Other substances, such as multi-layered or gradient substrates may also be used. In some embodiments of the present disclosure, various operations can be performed to form optical devices such as modulators, waveguide, detector, gratings, and/or couplers in the semiconductor layer 306. Therefore, the semiconductor layer 306 can be referred to as an optical device layer 306. In other words, the optical device layer 306 includes modulator, waveguide, detector, grating or coupler. In some embodiments of the present disclosure, devices other than the optical devices can be formed if required. Additionally, a dielectric layer 308 including insulating material(s) can be formed over insulator layer 304 to provide protection and form a planar surface for following operations.

Still referring to FIG. 4A, an interconnect structure 320 is formed over the substrate 300 at the first side 300*a*. Therefore, the optical device layer 306 is sandwiched between the least one insulator layer 304 and the interconnect structure 320. The interconnect structure 320 includes a first surface 320*a* and a second surface 320*b* opposite to the first surface 320*a*, and the second surface 320*b* of the interconnect structure 320 faces the substrate 300 and the dielectric layer 308 in the optical device layer 306. The interconnect structure 320 can include one or more redistribution layers (RDLs), and the RDL can include a layer of a dielectric layer 322 having conductive lines 324 formed therein. The RDLs may be formed in a back-end-of-line (BEOL) process, but is not limited thereto. The dielectric layer 322 can include, for example but not limited to, a polymer material, such as epoxy, polyimide, polybenzoxazole (PBO), and the like, or can be formed of commonly known dielectric materials, such as spin-on glass, silicon oxide (SiO), silicon oxynitride (SiON), or the like, formed by any suitable method such as spin coating. The conductive lines 324 can include a metal such as copper (Cu), silver (Ag), aluminum (Al), nickel (Ni), combination thereof, or the like. The interconnect structure 320 can be electrically coupled to the optical devices or other devices in the optical device layer 306.

Figure 4B:
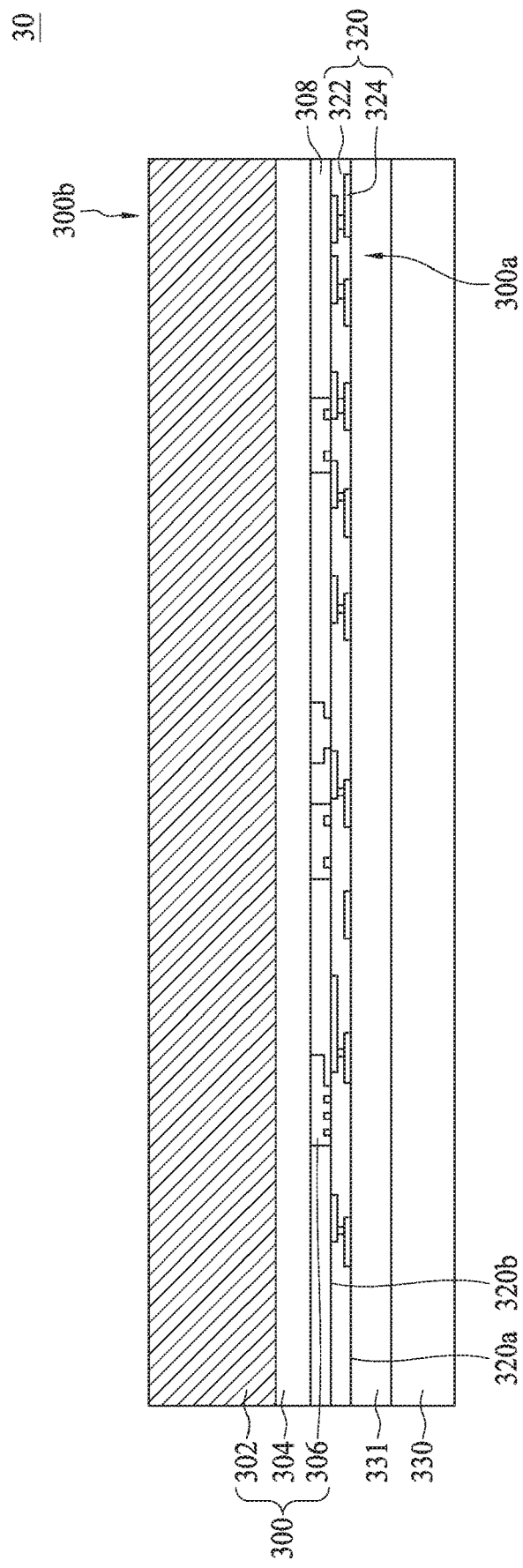
Figure 4C:
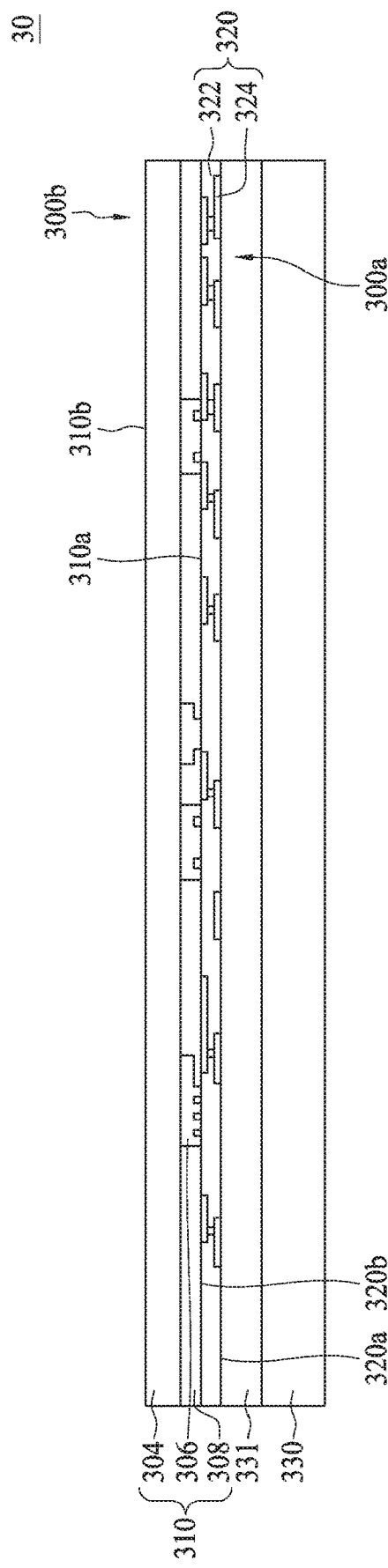
Figure 8:
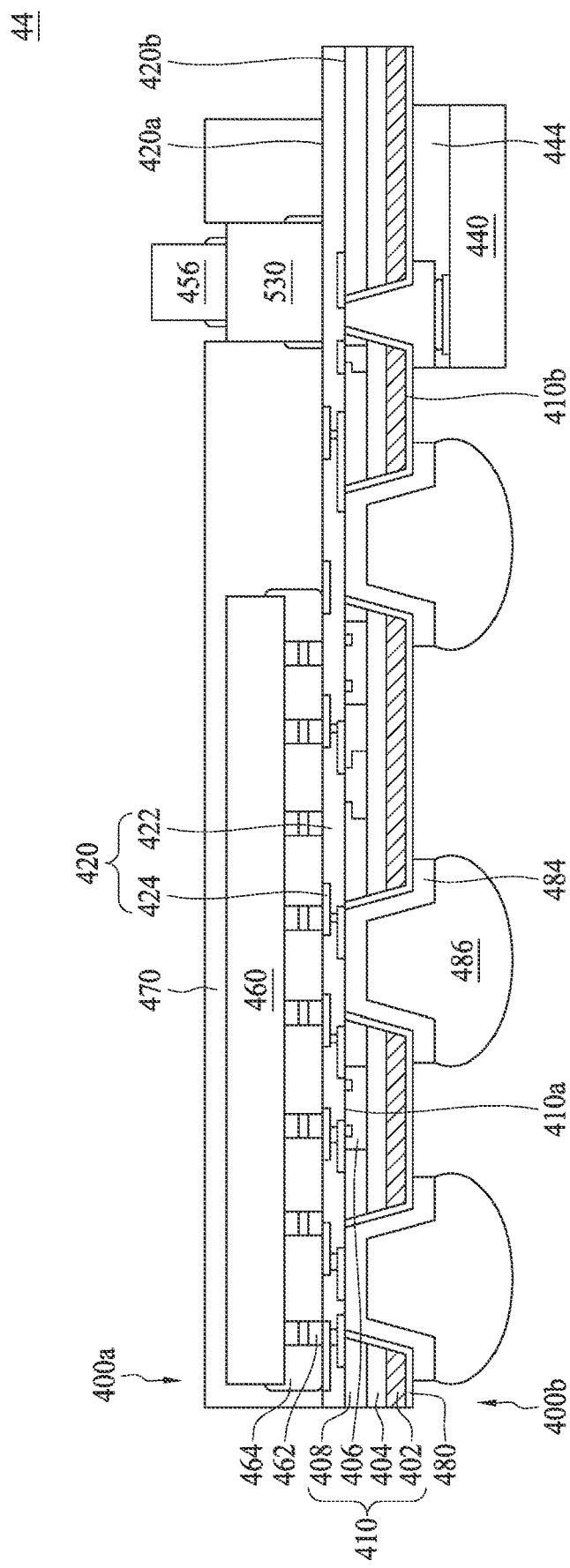
FIG. 8 is a sectional view of a semiconductor package according to other aspects of the present disclosure in some embodiments.

Referring to FIG. 4B and FIG. 4C, the substrate 300 and the interconnect structure 320 are then flipped over and attached to a carrier substrate 330 at the first side 300*a* through an adhesive material 331, such as a tape, a die attach film (DAF), or the like. Thereafter, the substrate 300 is thinned from the second side 300*b* according to Operation 104. Generally, the thinning can be, for example but not limited to, an etching, a grinding, or a planarization operation (e.g., chemical mechanical polishing (CMP)). In some embodiments of the present disclosure, the bulk structure 302 of the substrate 300 is removed by thinning the substrate 300 from the second side 300*b*. In some embodiments of the present disclosure, the bulk structure 302 may be remained on the substrate 300 at the second side 300*b*, and the remained bulk structure 302 (as shown in FIG. 8) includes a thickness less than about 50 micrometers (μm). In some embodiments, the dielectric layer 308 and the thinned substrate including the insulator layer 304 and the semiconductor layer 306 with or without the bulk structure 302 are referred to as an insulating layer 310 contacting the second surface 320*b*, and the insulating layer 310 includes a thickness less than about 50 μm. As shown in FIG. 4C, the insulating layer 310 includes a third surface 310*a* facing the second surface 320*b* of the interconnect structure 320 and a fourth surface 310*b* opposite to the third surface 310*a*.

Figure 4D:
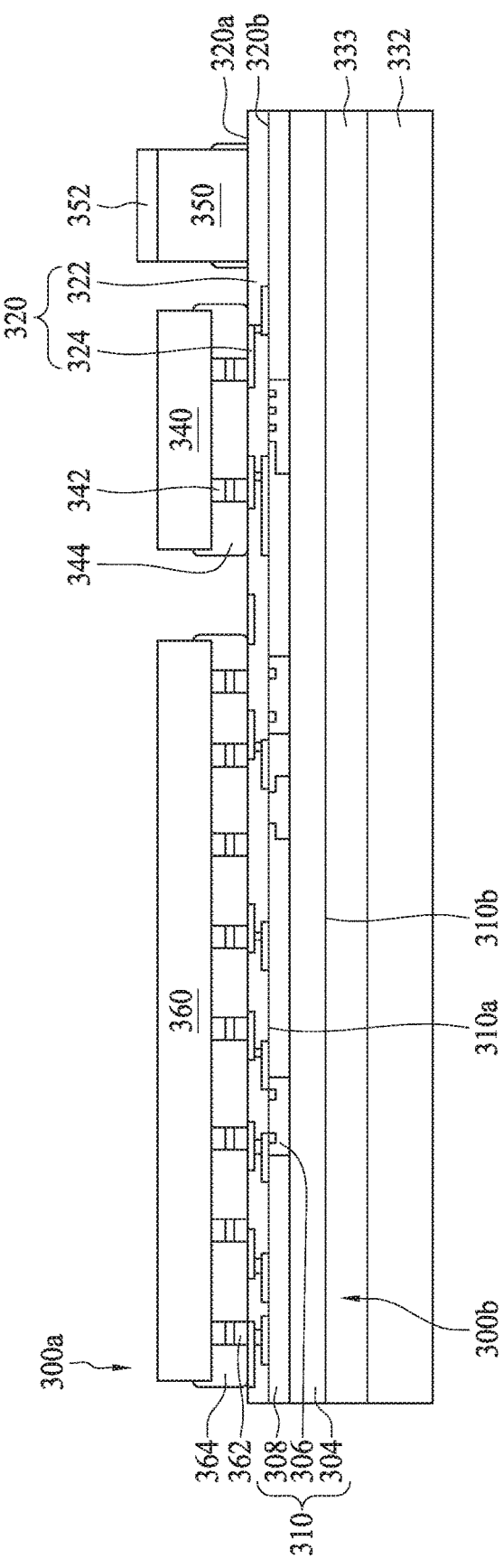

Referring to FIG. 4D, the insulating layer 310 and the interconnect structure 320 are then detached from the carrier substrate 330 and attached to another carrier substrate 332 at the second side 300*b* through another adhesive material 333, such as a tape, a DAF, or the like, and followed by removing the carrier substrate 330 and the adhesive material 331. As shown in FIG. 4D, at least one optical chip 340 is disposed over the first surface 320*a* of the interconnect structure 320 according to Operation 106. In some embodiments of the present disclosure, the optical chip 340 can include an assembly with an optical source such as, for example but not limited to, a semiconductor laser or a light-emitting diode. The optical chip 340 is electrically coupled to the interconnect structure 320 through conductive structures 342. In addition, the conductive structures 342 may be encapsulated with an underfill 344 for protection. In some embodiments, the conductive structure 342 includes a microbump having a bump height lower than 10 μm, for example, from 3 to 5 μm. The underfill material 344 can include, for example but not limited to, optical epoxy. Furthermore, a spacer 350 is affixed to the first surface 320*a* of the interconnect structure 320 through an optical glue. The spacer 350 is transparent to an electromagnetic wave of a predetermined wavelength range. In some embodiments of the present disclosure, the spacer 350 can include silicon or glass, but not limited to this. Additionally, a protecting layer 352 can formed over a top surface of the spacer 350 for protection. In some embodiments of the present disclosure, the protecting layer 352 can include a DAF, but not limited to this.

Still referring to FIG. 4D, in some embodiments of the present disclosure, a device chip 360 is disposed over the first surface 320*a* of the interconnect structure 320. The device chip 360 can be an electronic integrated circuit (EIC) chip. In some embodiments of the present disclosure, the device chip 360 can provide the required electronic functions of the semiconductor package 30. The device chip 360 is electrically coupled to the interconnect structure 320 through conductive structures 362. In addition, the conductive structures 362 may be encapsulated with an underfill 364 for protection.

Figure 4E:
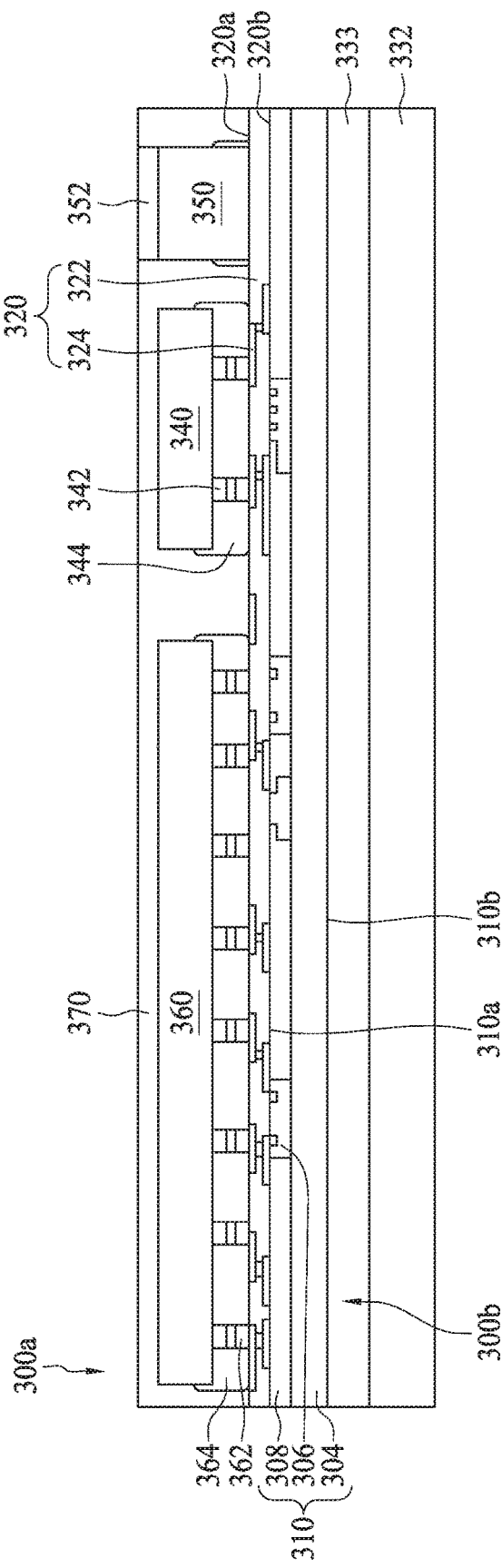

Referring to FIG. 4E, a molding compound 370 is disposed over the first surface 320*a* of the interconnect structure 320 according to Operation 108. As shown in FIG. 4E, the optical chip 340, the spacer 350 and the device chip 360 are molded in the molding compound 370. The molding compound 370 can be a single layer film or a composite stack. The molding compound 370 is applied to protect the optical chip 340, the spacer 350 and the device chip 360 and to provide mechanical stiffness and enhance the mechanical strength of the semiconductor package 30. The molding compound 370 may include any suitable material such as an epoxy resin, a molding underfill, or the like. Suitable methods for forming molding compound 370 may include compressive molding, transfer molding, liquid encapsulant molding, or the like. For example, molding compound 370 may be dispensed between the chips 340/360 and the spacer 350 in liquid form. Subsequently, a curing process is performed to solidify molding compound 370. The filling of molding compound 370 may overflow over the chips 340/360 and the spacer 350 so that molding compound 370 covers top surfaces of the chips 340/360 and the spacer 350. In some embodiments of the present disclosure, a thinning operation is therefore performed to expose at least a top surface of the protecting layer 352. Such thinning operation may employ a mechanical grinding process, a chemical polishing process, an etching process, combination thereof, or the like. Consequently, at least an edge of the optical chip 340 is covered by the molding compound 370.

Figure 4F:
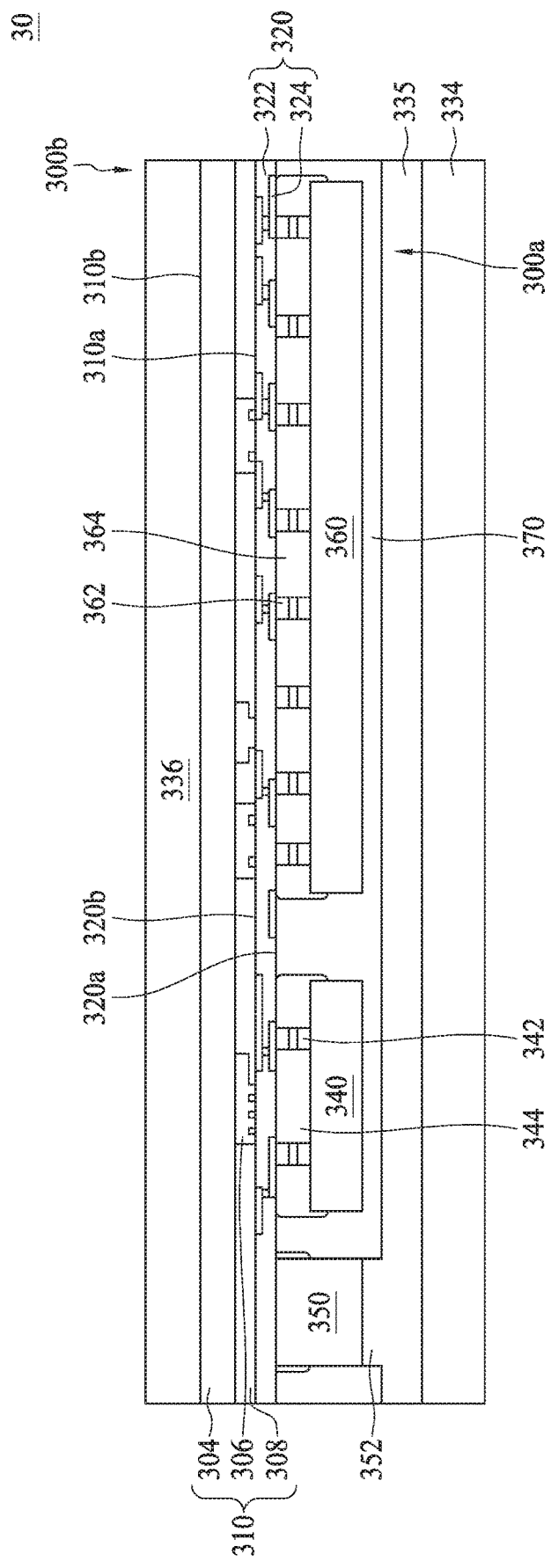
Figure 4G:
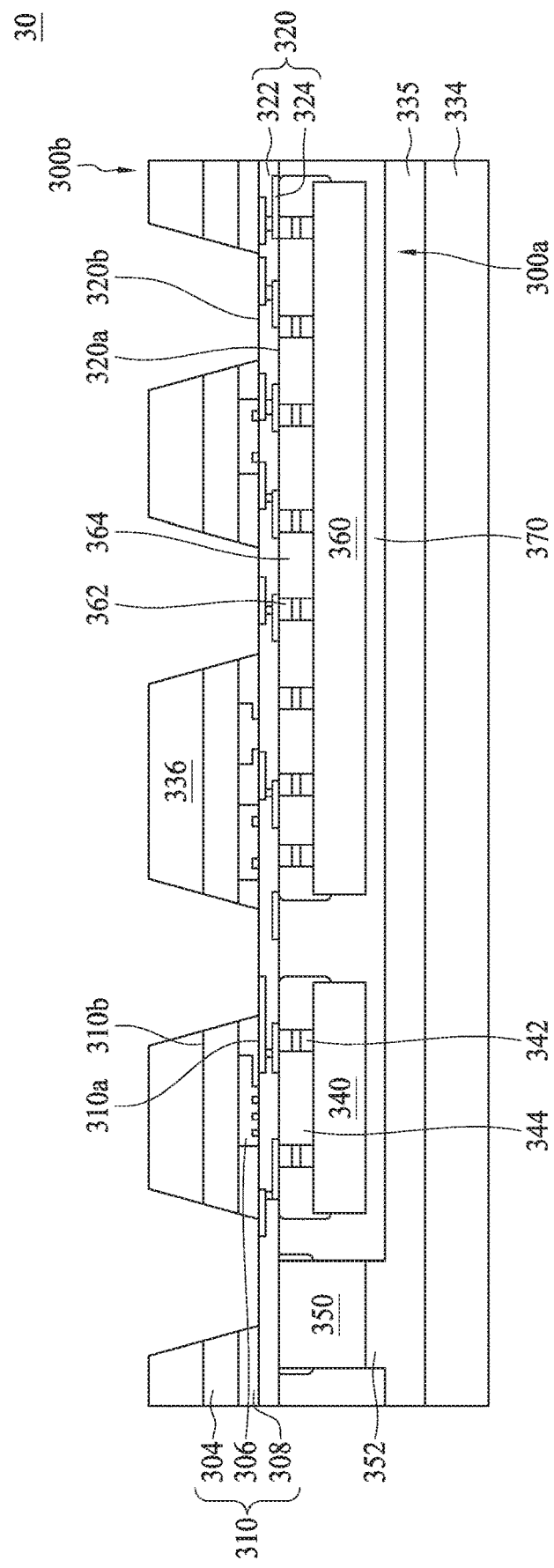

Referring to FIG. 4F and FIG. 4G, the semiconductor package 30 is then flipped over, detached from the carrier substrate 332, and attached to another carrier substrate 334 at the first side 300a through an adhesive material 335, such as a tape, a DAF, or the like, and followed by removing the carrier substrate 332 and the adhesive material 333. Subsequently, a photoresist 336 is formed on the insulating layer 310 at the second side 300b. As shown in FIG. 4G, the photoresist 336 is then patterned to define locations of external terminals, which will be described. Subsequently, the insulating layer 310 (including the insulator 304, the optical device layer 306 and the dielectric layer 308) is patterned to expose portions of the interconnect structure 320 at the second surface 320b.

Figure 4H:
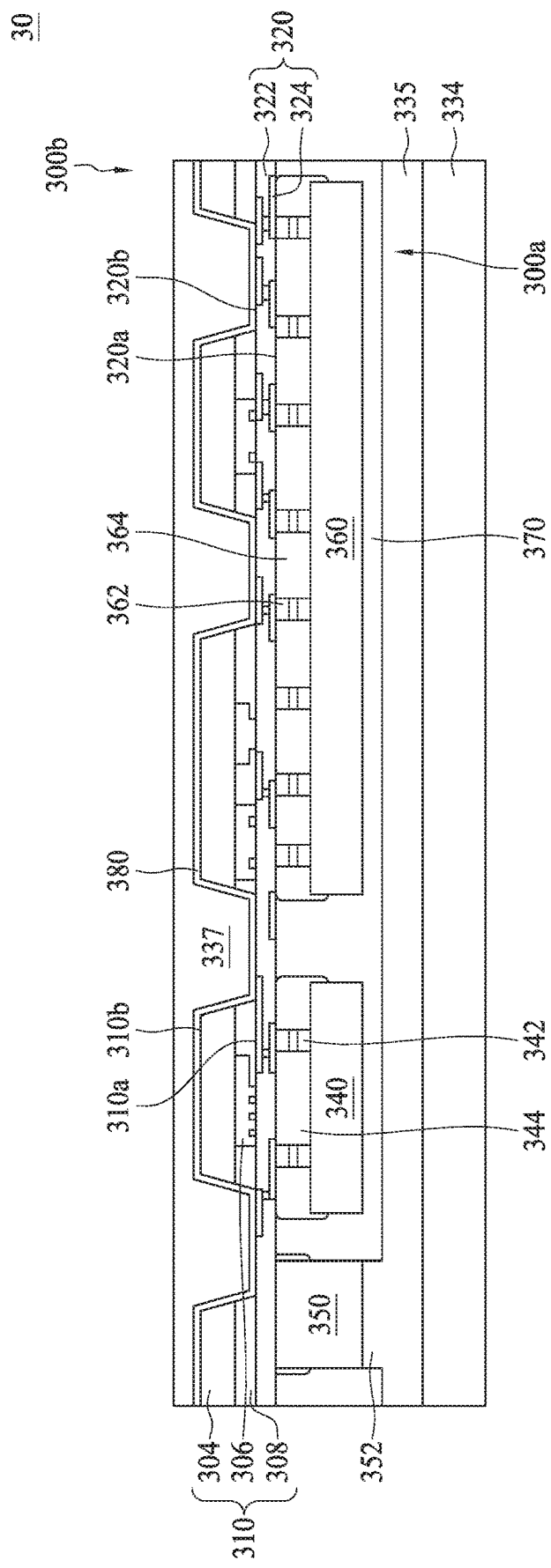
Figure 4I:
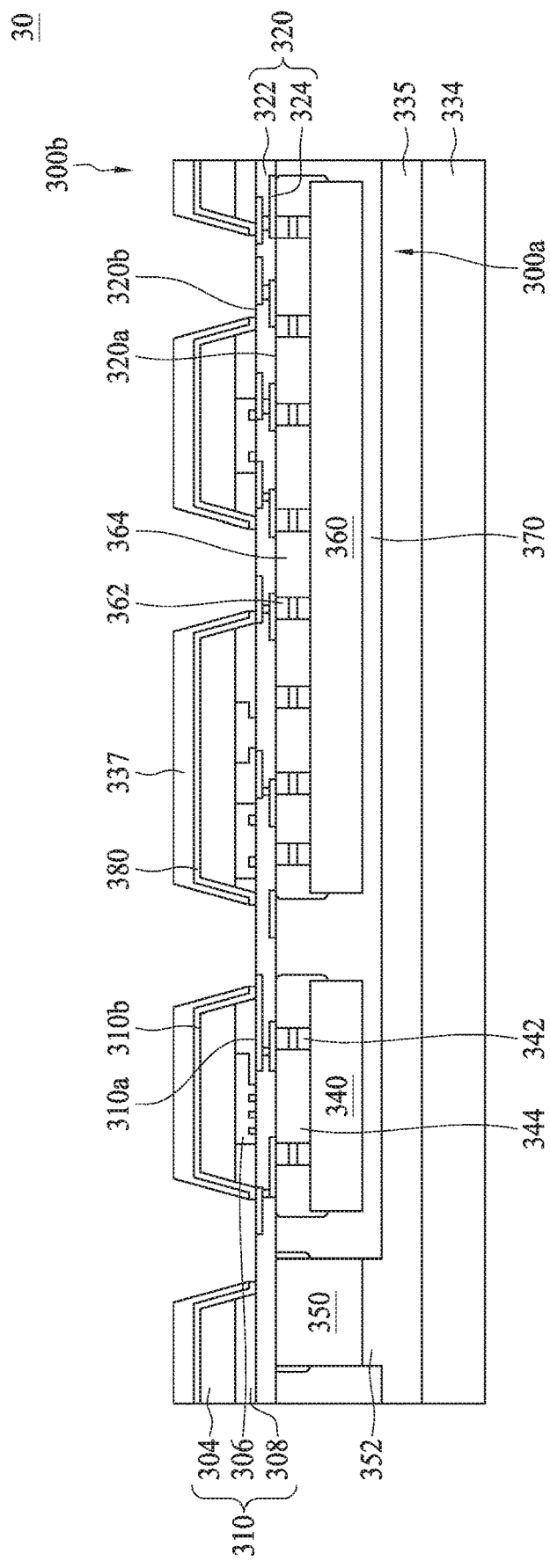

Referring to FIG. 4H and FIG. 4I, the patterned photoresist 336 is removed and followed by conformally forming a polymer layer 380 to cover the insulating layer 310 and the exposed portions of the interconnect structure 320. The polymer layer 380 includes a polymeric material such as epoxy, polyimide, polybenzoxazole (PBO), solder resist (SR), ABF film, and the like. Another photoresist 337 is formed on polymer layer 380 and patterned. Subsequently, the polymer layer 380 is patterned to expose portions of the interconnect structure 320 at the second surface 320b. In some embodiments, operations shown in FIG. 4H to FIG. 4I are optional.

Figure 4J:
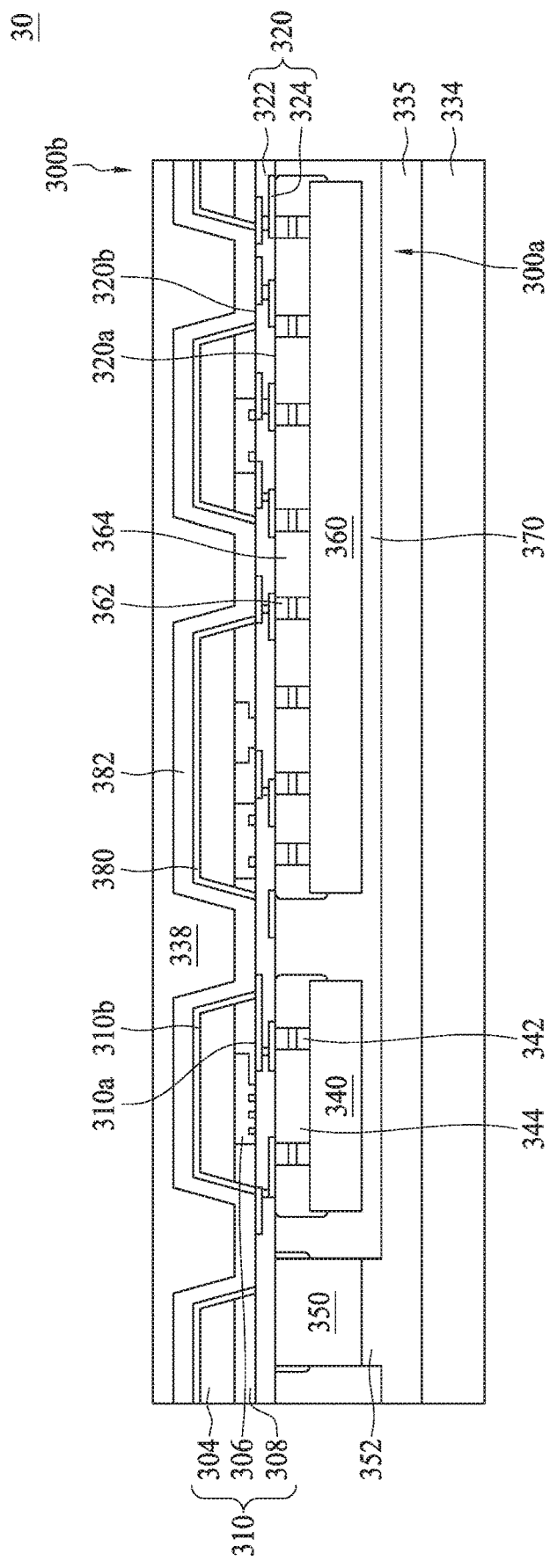
Figure 4K:
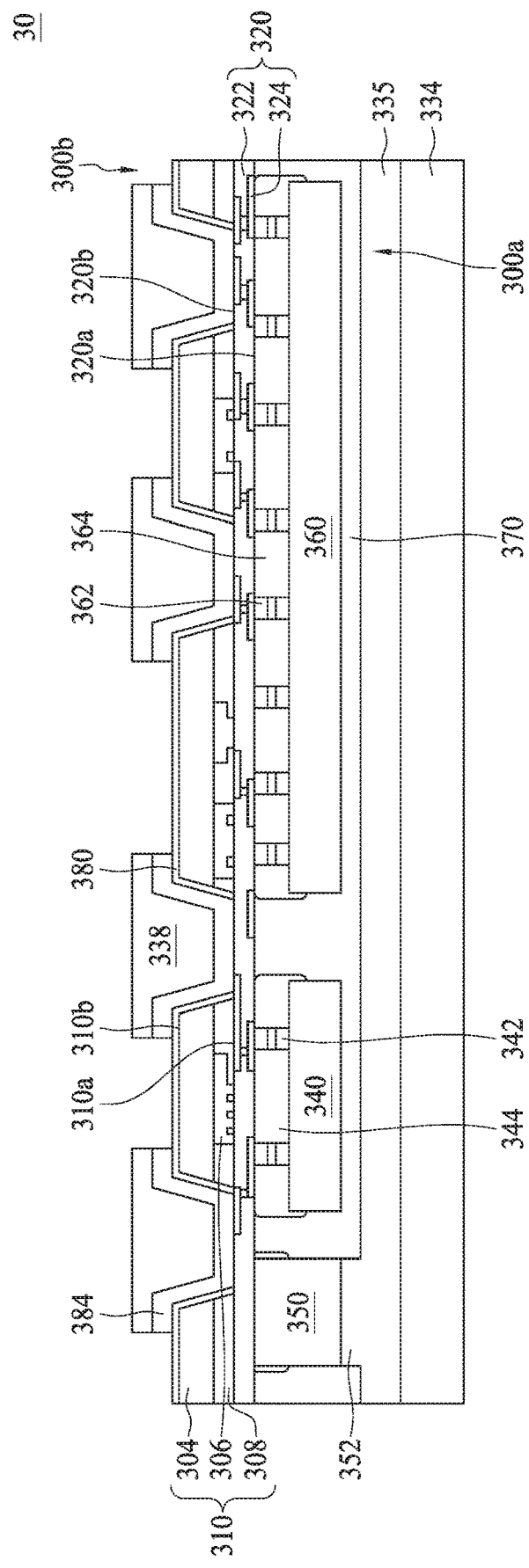

Referring to FIGS. 4J and 4K, the patterned photoresist 337 is then removed and followed by forming a conductive material 382 over insulating layer 310, the polymer layer 380, and the exposed portions of the interconnect structure 320. The conductive material 382 can be made, for example but not limited to, by physical vapor deposition (PVD), CVD, electrical plating, electroless plating, or any combinations thereof. In some embodiments, the process of forming the conductive material 382 can include an electroless nickel immersion gold (ENIG) process or an immersion tin (Im-Sn) process for forming ENIG or Im-Sn material on the surface of the conductive material 382. In some embodiments of the present disclosure, the conductive material 382 can include a diffusion barrier layer and a seed layer (not shown). The diffusion barrier layer may also function as an adhesion layer (or a glue layer), in some embodiments. The diffusion barrier layer may be formed of tantalum nitride (TaN), although it may also be formed of other materials such as titanium nitride (TiN), tantalum (Ta), titanium (Ti), or the like. The seed layer may be a Cu seed layer formed on the diffusion barrier layer. The Cu seed layer may be formed of Cu or one of Cu alloys that include Ag, Ni, chromium (Cr), tin (Sn), gold (Au), and combinations thereof. Thereafter, another photoresist 338 is formed on the conductive material 382 as shown in FIG. 4J, and the photoresists 338 is patterned as shown in FIG. 4K. Next, portions of the conductive material 382 are removed with the patterned photoresist 338 serving as a mask. Accordingly, a plurality of conductive layers 384 is formed over the substrate at the second side 300b according to Operation 110. In other words, the conductive layers 384 are formed over the fourth surface 310b of the insulating layer 310. The conductive layers 384 serve as under-bump-metallurgy (UBM) layers. As shown in FIG. 4K, the conductive layers 384 are electrically coupled to the interconnect structure 320.

As shown in FIG. 4K, because the thickness of the insulating layer 310 is less than 50 μm, the conductive layers 384 are able to provide the vertical electric connections from the first side 300a to the second side 300b of the insulating layer 310. In other words, TSVs that conventionally used to provide vertical electrical connections are replaced with the conductive layers 384.

Figure 4L:
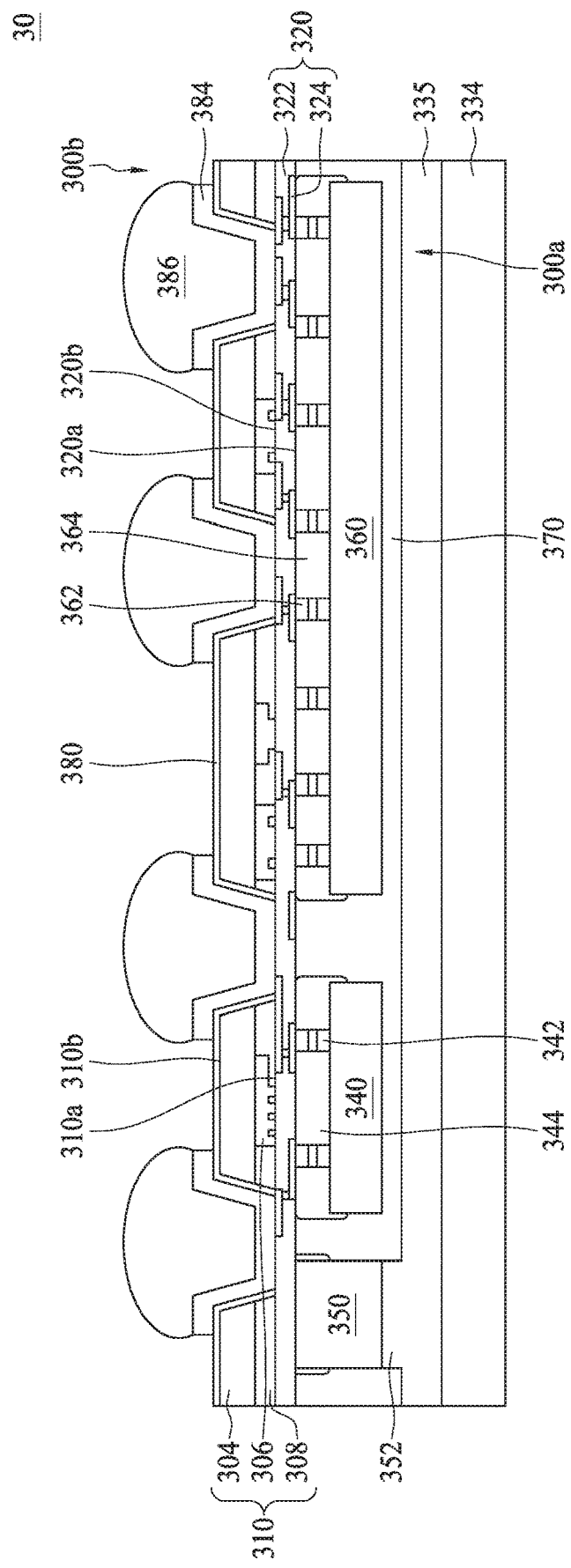
Figure 4M:
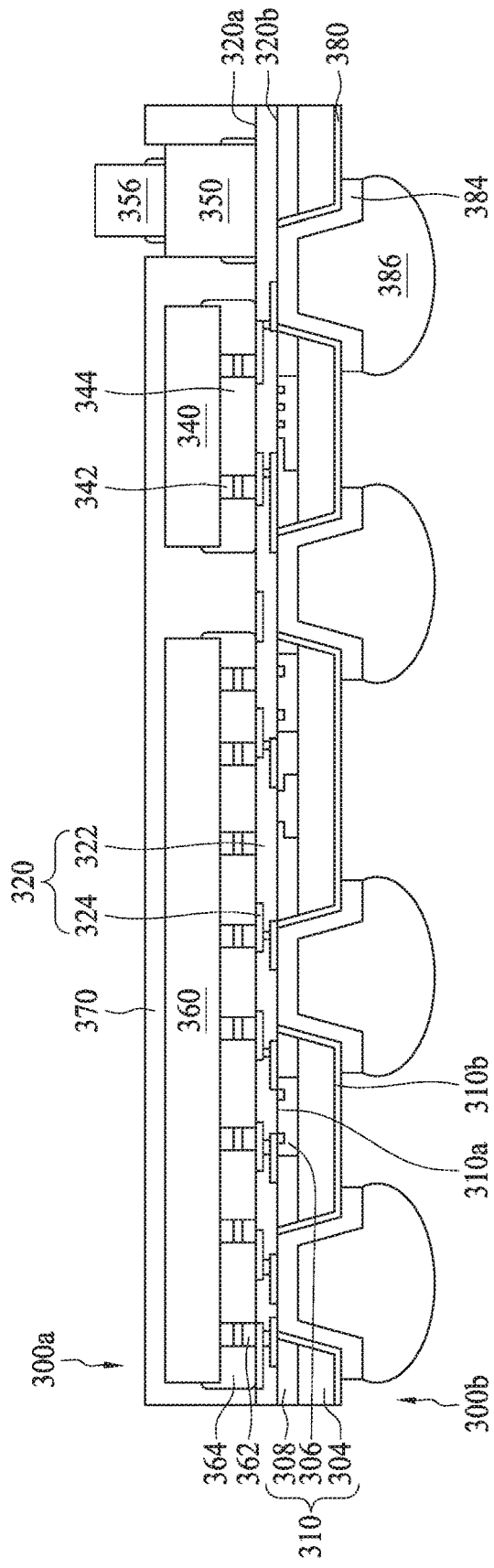

Referring to FIGS. 4L and 4M, the patterned photoresist 338 is removed. A plurality of external terminals 386 is formed in contact with the conductive layers 384. The external terminals 386 can include solder balls, metal pads, metal pillars, and/or combination thereof, and may be formed of Au, Ag, Ni, Al, tungsten (W), and/or alloys thereof. The adhesive material 335 and the carrier substrate 334 are then removed, and the semiconductor package 30 is flipped over. As shown in FIG. 4M, the protecting layer 352 over the top surface of the spacer 350 is removed and an optical fiber or other external optical coupling device 356 is affixed to the top surface of the spacer 350 through, for example but not limited to, an optical glue. The optical fiber 356 is configured to transmit the electromagnetic wave of the predetermined wavelength range.

As shown in FIG. 4M, the optical chip 340 is disposed on the interconnect structure 320 and the insulating layer 310. Since the thickness of the insulating layer 310 (including the dielectric layer 308, the optical device 306 and the insulator layer 304) with or without the bulk structure is reduced to 50 μm or below, electrical path length through vertical electric connections in the insulating layer 310 is shortened. Accordingly, electrical loss is reduced. Additionally, the substrate 300 is thinned enough such that the conductive layer 384 can serve as a mirror. In some embodiments of the present disclosure, the optical path of emission of optical chip 340 projectively overlaps the conductive layers 384, such that light can be reflected by the conductive layers 384. Accordingly, optical loss can be further reduced and optical coupling efficiency can be improved. In some embodiments of the present disclosure, the substrate 300 is thinned down to that only entire or partial insulating layer 310 is remained on the second side 300b of substrate 300, which also reduces optical loss caused by optical guiding within bulk structure 302.

Figure 5:
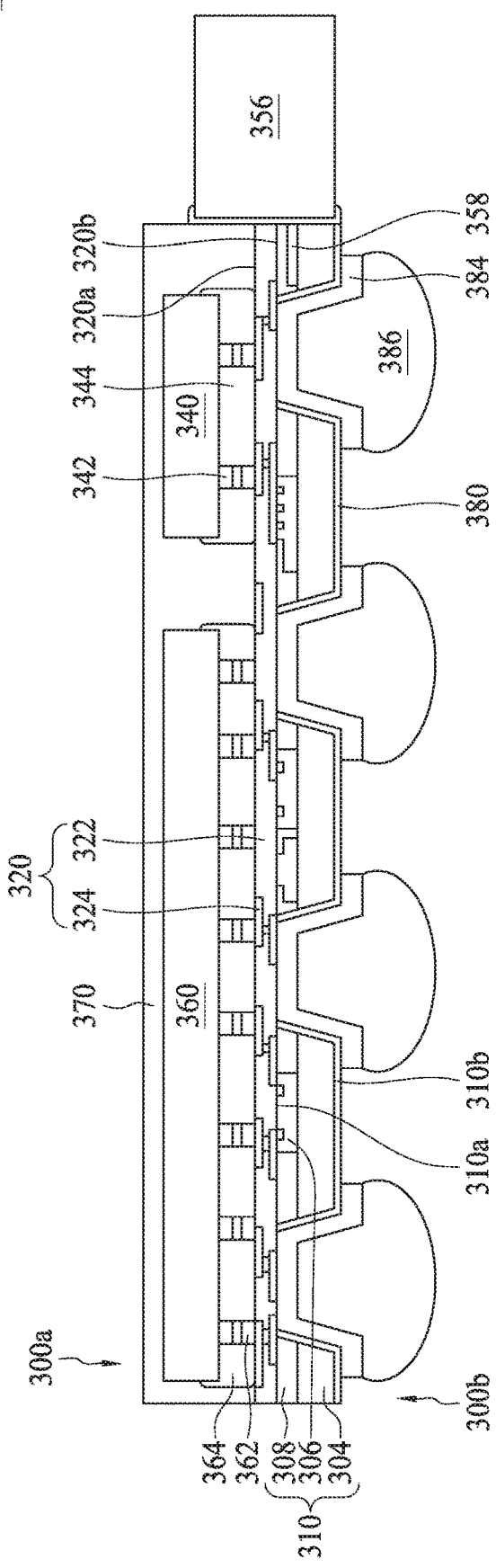
FIG. 5 is a sectional view of a semiconductor package according to other aspects of the present disclosure in some embodiments.

FIG. 5 is a sectional view of a semiconductor package 32 according to aspects of the present disclosure in some embodiments. Accordingly, similar features in FIGS. 4A-4M and 5 are identified by the same reference numerals for clarity and simplicity. The method for manufacturing the semiconductor package 10 can be performed to form the semiconductor package 32 and those details are omitted in the interest of brevity. As shown in FIG. 5, in some embodiments of the disclosure, the optical fiber or other external optical coupling device 356 is affixed to lateral surfaces of the interconnect structure 320 and the insulating layer 310 through an optical glue. And at least one edge coupler 358 is formed in the optical device layer 306 in the insulating layer 310 adjacent to the optical fiber or other external optical coupling device 356.

According to the abovementioned embodiment, the optical chip 340 is molded in the molding compound 370, the flatness of the semiconductor package 30 and 32 is therefore improved.

Figure 6A:
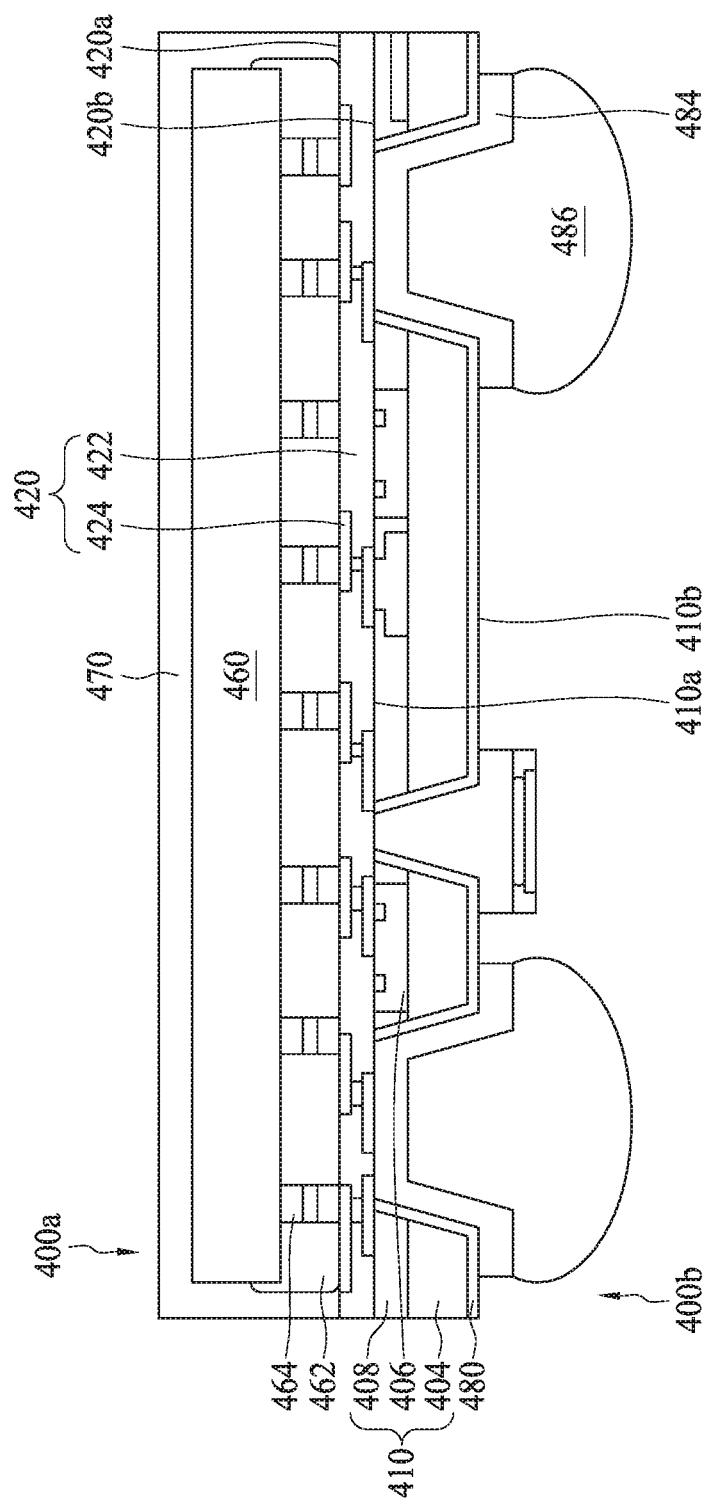
FIGS. 6A through 6B illustrate sectional views of a semiconductor package at various fabrication stages constructed according to aspects of the present disclosure in one or more embodiments.
Figure 6B:
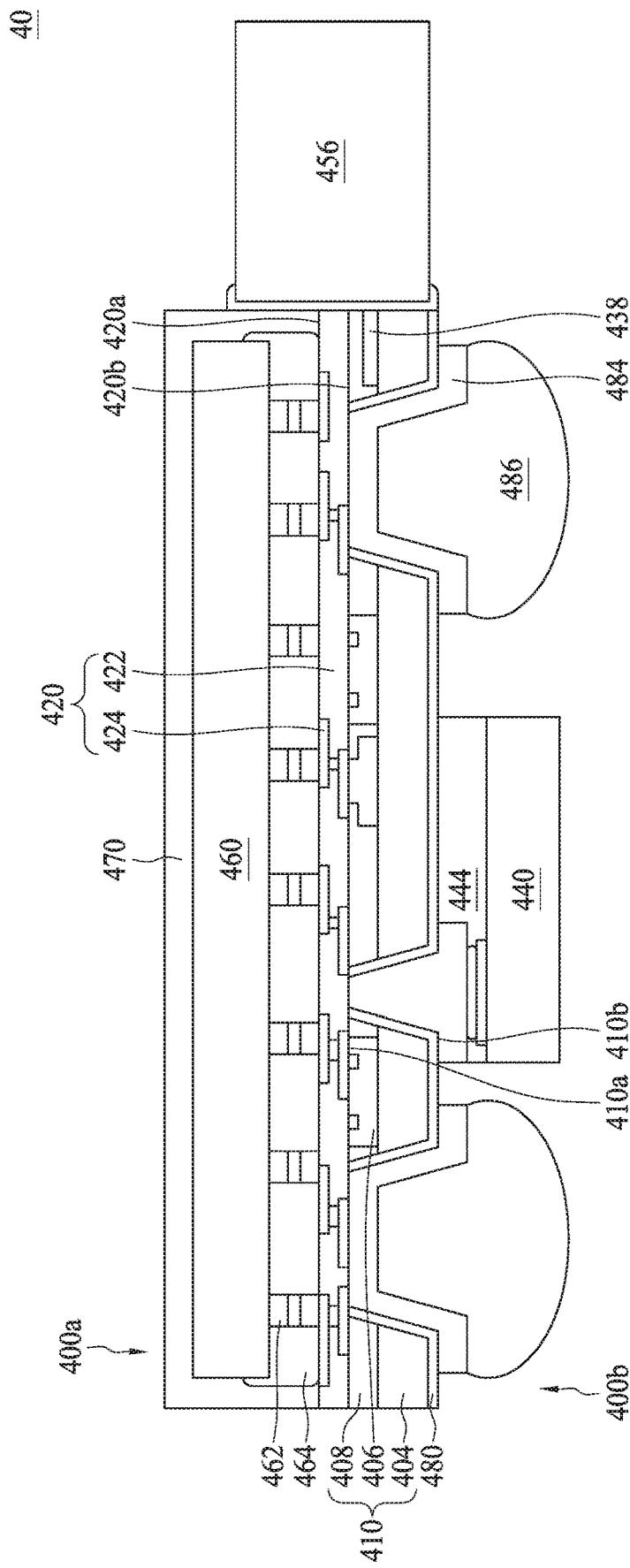

FIGS. 6A through 6B illustrate sectional views of a semiconductor package 40 at various fabrication stages constructed according to aspects of the present disclosure in some embodiments.

Referring to FIG. 6A-6B, it should be understood that similar features in FIGS. 4A-4M and 6A-6B may include the similar materials, thus those details are omitted in the interest of brevity. And the method for forming the semiconductor package 11 can be performed to form the semiconductor package 40. Referring to FIG. 6A, a substrate (not shown) is provided according to Operation 112. The substrate includes a first side 400a and a second side 400b opposite to the first side 400a. In some embodiments of the present disclosure, the substrate may include a SOI substrate. In some embodiments of the present disclosure, the substrate 400 may include a semiconductor layer 406 formed on an insulator layer 404 at the first side 400a, and the insulator layer 404 is provided on a bulk structure 402 (as shown in FIG. 8). In some embodiments of the present disclosure, various operations can be performed to form optical devices such as modulators, waveguide, detector, gratings, and/or couplers in the semiconductor layer 406. Therefore, the semiconductor layer 406 can be referred to as an optical device layer 406. In other words, the optical device layer 406 includes modulator, waveguide, detector, grating or coupler. In some embodiments of the present disclosure, devices other than the optical devices can be formed if required. Additionally, a dielectric layer 408 can be formed on the insulator layer 404 to provide protection and form a planar surface for following operations.

Still referring to FIG. 6A, an interconnect structure 420 is formed over the substrate at the first side 400a. Therefore, the optical device layer 406 is sandwiched between the least one insulator layer 404 and the interconnect structure 420. The interconnect structure 420 includes a first surface 420a and a second surface 420b opposite to the first surface 420a, and the second surface 420b of the interconnect structure 420 faces the substrate and the dielectric layer 408 in the optical device layer 406. The interconnect structure 420 can include one or more redistribution layers (RDLs), and the RDL can include a layer of a dielectric layer 422 having conductive lines 424 formed therein. As mentioned above, the RDLs may be formed in a back-end-of-line (BEOL) process, but is not limited thereto.

Still referring to FIG. 6A, the substrate and the interconnect structure 420 are then flipped over and attached to a carrier substrate (not shown) at the first side 400a through an adhesive material (not shown). Thereafter, the substrate is thinned from the second side 400b according to Operation 114. In some embodiments of the present disclosure, the bulk structure of the substrate is removed by thinning the substrate from the second side 400b. In some embodiments of the present disclosure, the bulk structure may be remained on the substrate at the second side 400b, and the remained bulk structure 402 (as shown in FIG. 8) includes a thickness less than about 50 µm. In some embodiments other words, the dielectric layer 408 and the thinned substrate including the insulator layer 404 and the semiconductor layer 406 with or without the bulk structure are referred to as an insulating layer 410, and the insulating layer 410 includes a thickness less than about 50 µm. As shown in FIG. 6A, the insulating layer 410 includes a third surface 410a facing the second surface 420b of the interconnect structure 420 and a fourth surface 410b opposite to the third surface 410a.

Still referring to FIG. 6A, the insulating layer 410 and the interconnect structure 420 are then attached to another carrier substrate (not shown) at the second side by another adhesive material (not shown). And the above mentioned carrier substrate and adhesive material are removed from the first side 400a of the substrate. As shown in FIG. 6A, at least one device chip 460 is disposed over the first surface 420a of the interconnect structure 420. The device chip 460 can be an electronic integrated circuit (EIC) chip. In some embodiments of the present disclosure, the device chip 460 can provide the required electronic functions of the semiconductor package 40. The device chip 460 is electrically coupled to the interconnect structure 420 through conductive structures 462. In addition, the conductive structures 462 may be encapsulated with an underfill 464 for protection.

Still referring to FIG. 6A, a molding compound 470 is disposed over the first surface 420a of the interconnect structure 420 according to Operation 116. As shown in FIG. 6A, the device chip 460 is molded in the molding compound 470. Subsequently, the semiconductor package 40 is then flipped over and attached to another carrier substrate (not shown) at the first side 400a through an adhesive material (not shown). Next, the insulating layer 410 (including the insulator 404, the optical device layer 406 and the dielectric layer 408) is patterned to expose portions of the interconnect structure 420 at the second surface 420b. A polymer layer 480 is then conformally formed to cover the insulating layer 410 and the exposed portions of the interconnect structure 420. Subsequently, the polymer layer 480 is patterned to expose portions of the interconnect structure 420 at the second surface 420b.

Still referring to FIG. 6A, a conductive material is formed over the polymer 480 and followed by patterning. Consequently, a plurality of conductive layers 484 is formed over the substrate at the second side 400b according to Operation 118. In other words, the conductive layers 484 are formed over the fourth surface 410b of the insulating layer 410. The conductive layers 484 serve as UBM layers. A plurality of external terminals 486 is then formed in contact with the conductive layers 484.

As mentioned above, because the thickness of the insulating layer 410 is less than 50 µm, the conductive layers 484 are able to provide the vertical electric connections from the first side 400a to the second side 400b of the insulating layer 410. In other words, TSVs that conventionally used to provide vertical electrical connections are replaced with the conductive layers 484.

Referring to FIG. 6B, an optical chip 440 is then disposed over the substrate at the second side 400b according to Operation 120. In other words, the optical chip 440 is disposed over the fourth surface 410b of the insulating layer 410. The optical chip 440 is electrically coupled to the interconnect structure 420 through the conductive layer 484 as shown in FIG. 6B. Furthermore, the optical chip 440 can be affixed to the substrate through an underfill material 444. As shown in FIG. 6B, in some embodiments of the disclosure, an optical fiber or other external optical coupling device 456 is affixed to lateral surfaces of the interconnect structure 420 and the insulating layer 410 through an optical glue (not shown). And at least one edge coupler 458 is formed in the optical device layer 406 in the insulating layer 410 adjacent to the optical fiber 456.

Figure 7:
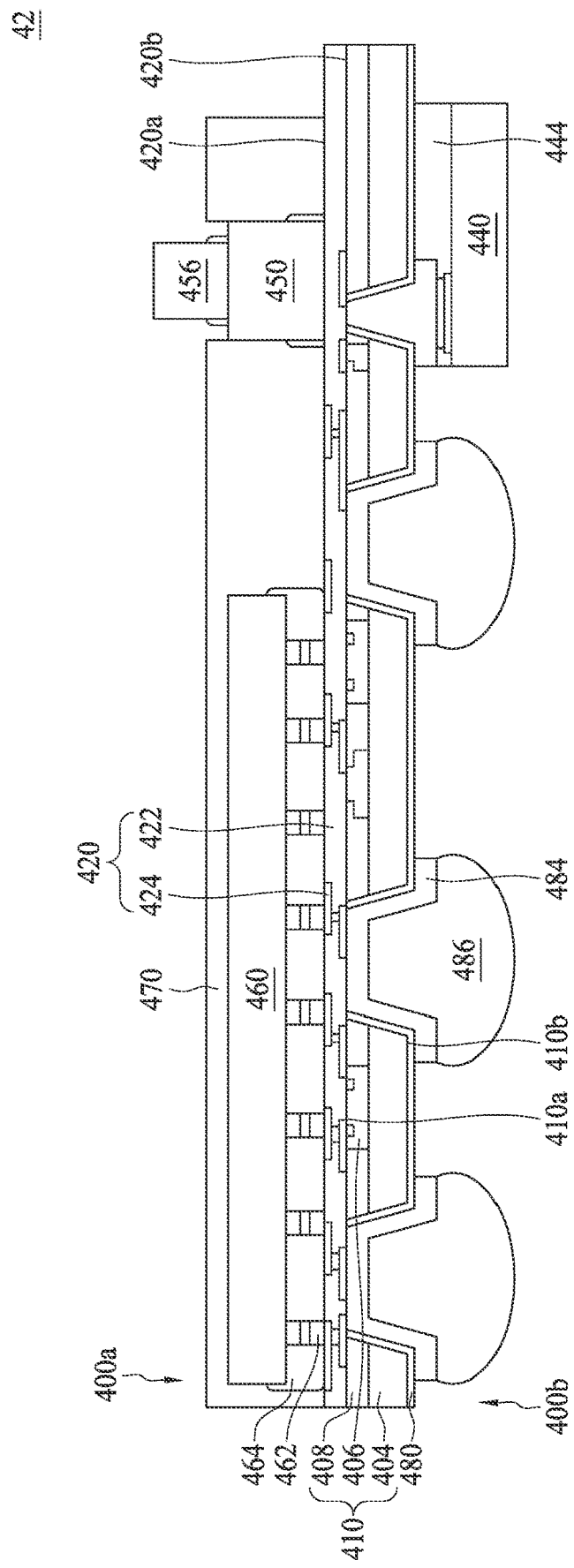
FIG. 7 is a sectional view of a semiconductor package according to other aspects of the present disclosure in some embodiments.

FIG. 7 is a sectional view of a semiconductor package 42 according to aspects of the present disclosure in some embodiments. Accordingly, similar features in FIGS. 6A-6B and 7 are identified by the same reference numerals for clarity and simplicity. The method for manufacturing the semiconductor package 11 can be performed to form the semiconductor package 42. As shown in FIG. 7, in some embodiments of the disclosure, a spacer 450 is affixed to the first surface 420a of the interconnect structure 420 through an optical glue before performing Operation 116. The spacer 450 is transparent to an electromagnetic wave of a predetermined wavelength range. In some embodiments of the present disclosure, the spacer 450 can include silicon or glass, but not limited to this. And an optical fiber or other external optical coupling device 456 is affixed to the top surface of the spacer 450 through, for example but not limited to, an optical glue after Operation 120. The optical fiber or other external optical coupling device 456 is configured to transmit the electromagnetic wave of the predetermined wavelength range. Accordingly, optical coupling efficiency can be further improved.

FIG. 8 is a sectional view of a semiconductor package 44 according to aspects of the present disclosure in some embodiments. Accordingly, similar features in FIGS. 6A-6B and 8 are identified by the same reference numerals for clarity and simplicity. The method for manufacturing the semiconductor package 11 can be performed to form the semiconductor package 44. As shown in FIG. 8, in some embodiments of the disclosure, the bulk structure 402 can be remained on the substrate 400 at the second side 400b, and the remained bulk structure 402 includes a thickness less than about 50 μm.

According to the abovementioned embodiments, the optical chip 440 is disposed at the second side 400b while the device chip 460 is at the first side 400a. In other words, the optical chip 440 and the device chip 460 are disposed at opposite sides of the semiconductor package 40/42/44. As shown in FIGS. 6A through 8, though the optical chip 440 is not molded in the molding compound 470, the optical chip 440 is disposed at the second side 400b where the conductive layers 484 and the external terminals 486 are disposed, therefore flatness of the semiconductor package 40/42/44 is still improved.

FIGS. 9A through 9G illustrate sectional views of a semiconductor package 50 at various fabrication stages constructed according to aspects of the present disclosure in some embodiments. It should be understood that similar features in FIGS. 4A-4M and 9A-9G may include the similar materials, thus those details are omitted in the interest of brevity. The method for manufacturing the semiconductor package 20 can be performed to form the semiconductor package 50 and those details are omitted in the interest of brevity.

Figure 9A:
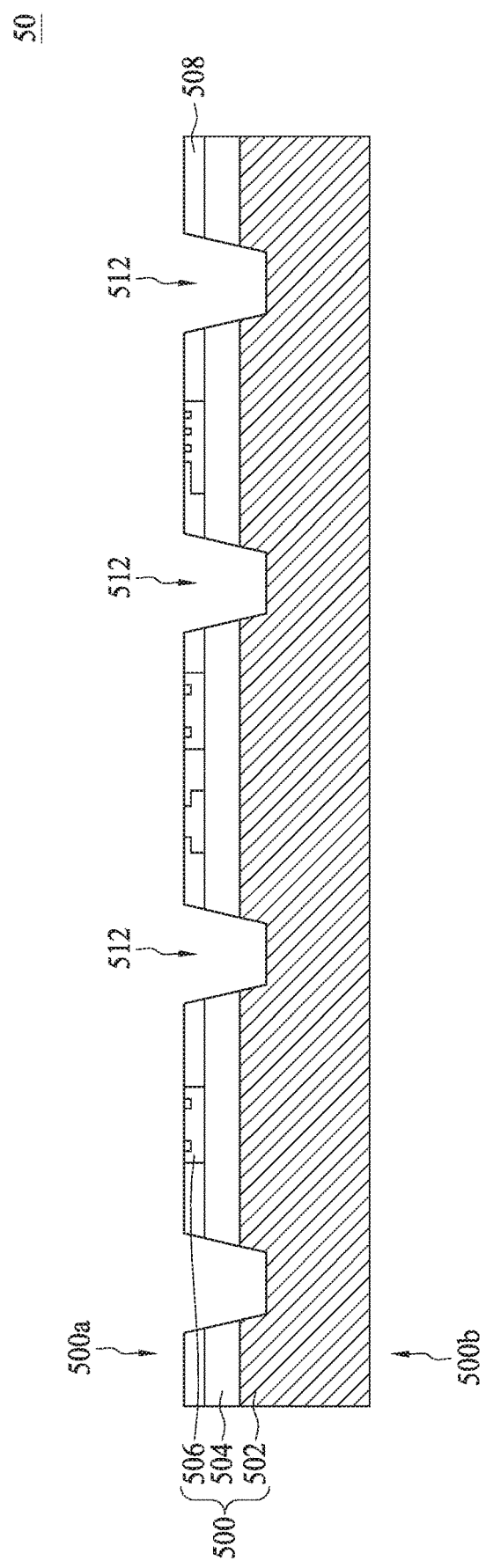
FIGS. 9A through 9G illustrate sectional views of a semiconductor package at various fabrication stages constructed according to aspects of the present disclosure in one or more embodiments.

Referring to FIG. 9A, a substrate 500 is provided according to Operation 202. The substrate 500 includes a first side 500a and a second side 500b opposite to the first side 500a. In some embodiments of the present disclosure, the substrate 500 includes a semiconductor layer 506 formed on an insulator layer 504 at the first side 500a. The insulator layer 504 is provided on a bulk structure 502, typically a silicon or glass substrate. Other substances, such as multi-layered or gradient substrates may also be used. In some embodiments of the present disclosure, various operations can be performed to form optical devices such as modulators, waveguide, detector, gratings, and/or couplers in the semiconductor layer 506. Therefore, the semiconductor layer 506 can be referred to as an optical device layer 506. In other words, the optical device layer 506 includes modulator, waveguide, detector, grating or coupler. In some embodiments of the present disclosure, devices other than the optical devices can be formed if required. Additionally, a dielectric layer 508 including insulating material(s) can be formed over insulator layer 504 to provide protection and form a planar surface for following operations. In some embodiments, a plurality of openings 512 can be formed in the insulating layer 508, the semiconductor layer 506, the insulator layer 504, and the bulk structure 502, as shown in FIG. 9A.

Figure 9B:
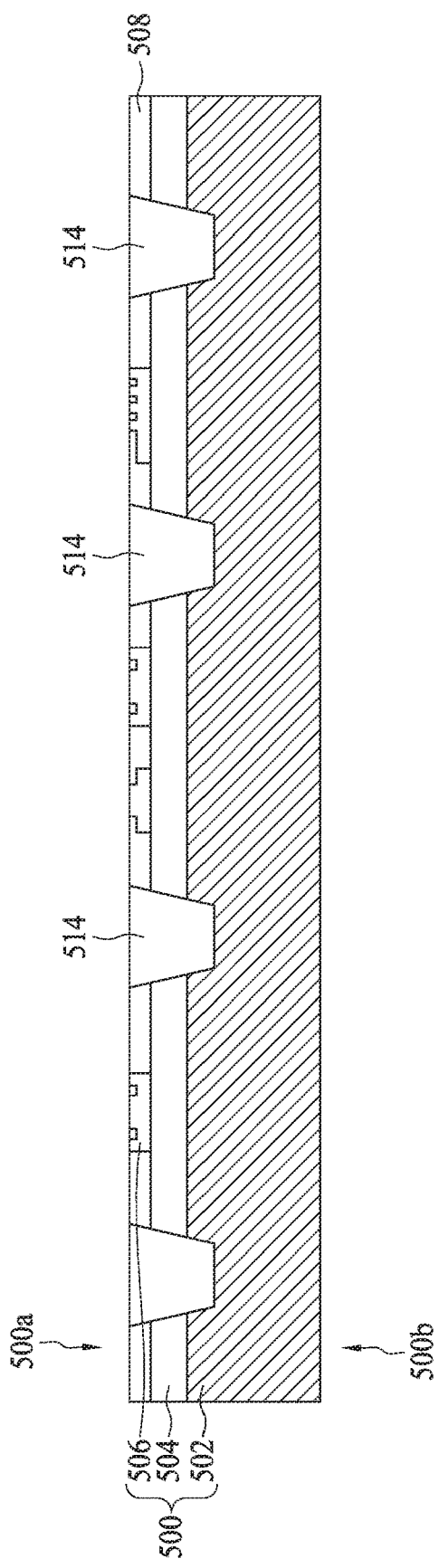
Figure 9C:
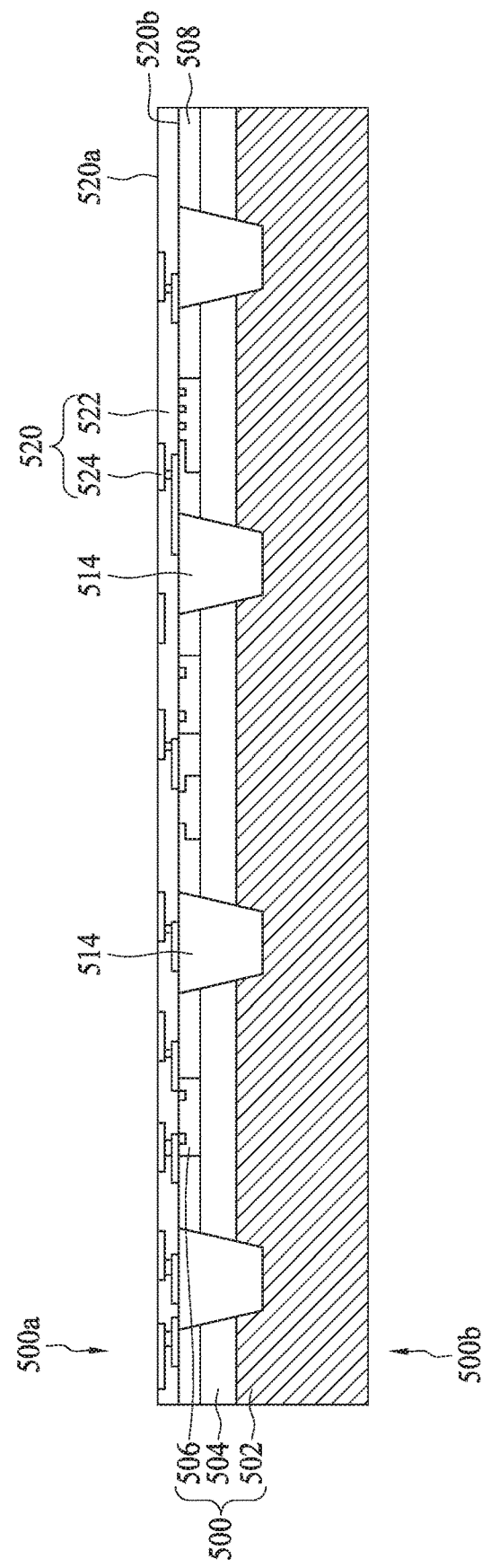

Referring to FIG. 9B, a plurality of connectors 514 is formed in the openings 512. In some embodiments, the connectors 514 fill the openings 512, but the disclosure is not limited thereto. Referring to FIG. 9C, an interconnect structure 520 is formed over the substrate 500 at the first side 500a according to operation 202. Therefore, the optical device layer 506 is sandwiched between the least one insulator layer 504 and the interconnect structure 520. The interconnect structure 520 includes a first surface 520a and a second surface 520b opposite to the first surface 520a, and the second surface 520b of the interconnect structure 520 faces the substrate 500 and the dielectric layer 508 in the optical device layer 506. The interconnect structure 520 can include one or more RDLs, and the RDL can include a layer of a dielectric layer 522 having conductive lines 524 formed therein. The interconnect structure 520 can be electrically coupled to the optical devices or other devices in the optical device layer 506. In some embodiments, the interconnect structure 520 is electrically coupled to the connectors 514.

Figure 9D:
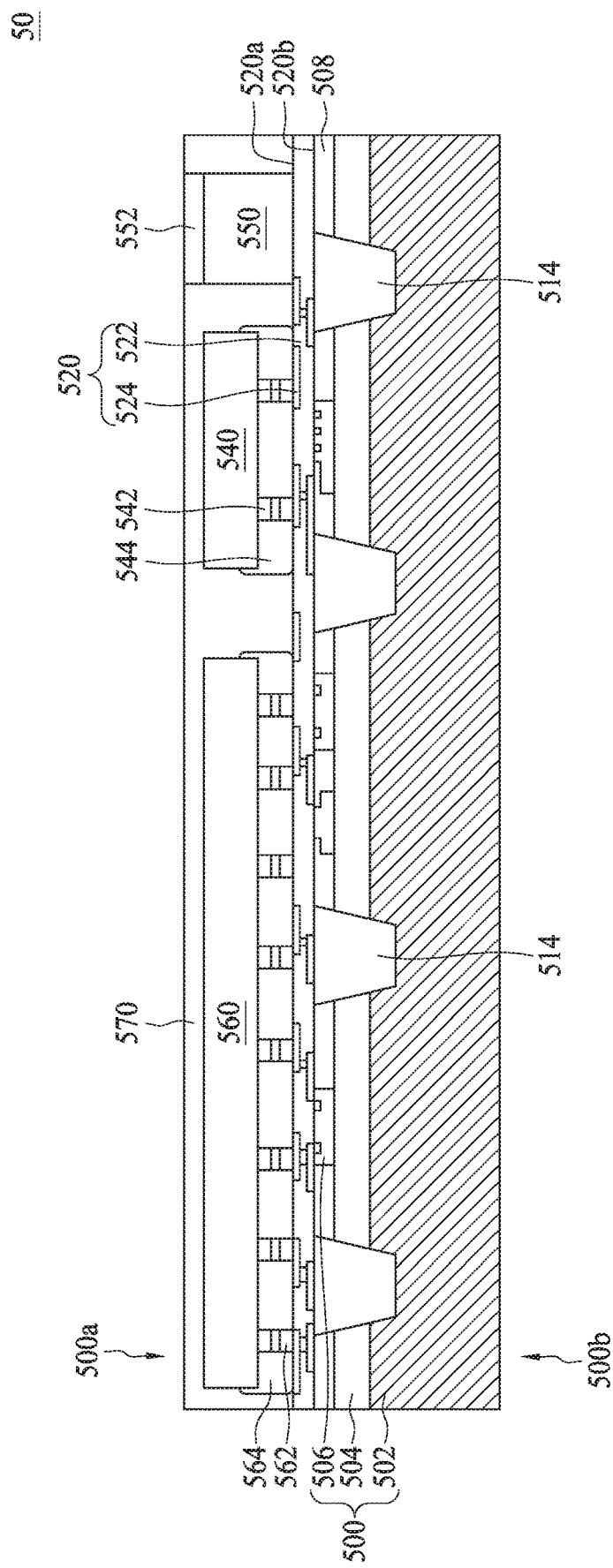

Referring to FIG. 9D, at least one optical chip 540 is disposed over the first surface 520a of the interconnect structure 520 according to Operation 204. In some embodiments of the present disclosure, the optical chip 540 can include an assembly with an optical source such as, for example but not limited to, a semiconductor laser or a light-emitting diode. The optical chip 540 is electrically coupled to the interconnect structure 520 through conductive structures 542. In addition, the conductive structures 542 may be encapsulated with an underfill 544 for protection. Furthermore, a spacer 550 is affixed to the first surface 520a of the interconnect structure 520 through an optical glue. The spacer 550 is transparent to an electromagnetic wave of a predetermined wavelength range. Additionally, a protecting layer 552 can formed over a top surface of the spacer 550 for protection. In some embodiments of the present disclosure, the protecting layer 552 can include a DAF, but not limited to this. In some embodiments of the present disclosure, a device chip 560 is disposed over the first surface 520a of the interconnect structure 520. The device chip 560 can be an electronic integrated circuit (EIC) chip. In some embodiments of the present disclosure, the device chip 560 can provide the required electronic functions of the semiconductor package 50. The device chip 560 is electrically coupled to the interconnect structure 520 through conductive structures 562. In addition, the conductive structures 562 may be encapsulated with an underfill 564 for protection.

Still referring to FIG. 9D, a molding compound 570 is disposed over the first surface 520a of the interconnect structure 520 according to Operation 206. As shown in FIG. 9D, the optical chip 540, the spacer 550 and the device chip 560 are molded in the molding compound 570. The molding compound 570 can be a single layer film or a composite stack. The molding compound 570 is applied to protect the optical chip 540, the spacer 550 and the device chip 560 and to provide mechanical stiffness and enhance the mechanical strength of the semiconductor package 50. In some embodiments of the present disclosure, at least an edge of the optical chip 540 is covered by the molding compound 570.

Figure 9E:
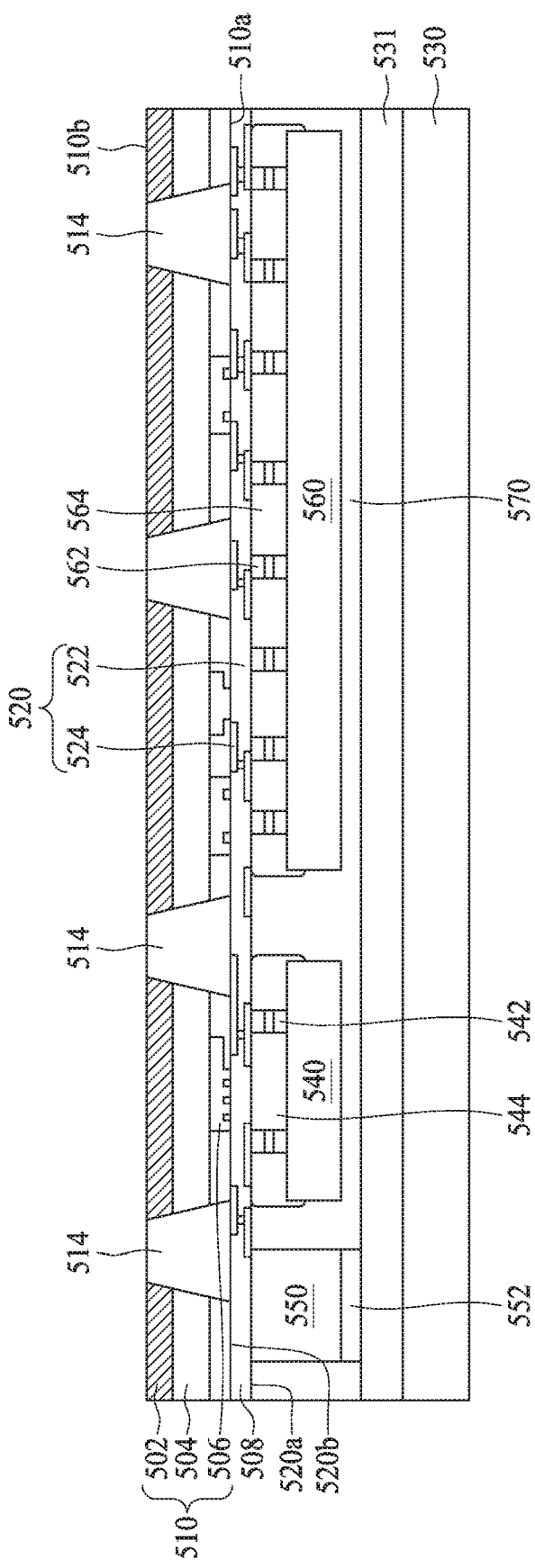

Referring to FIG. 9E, the substrate 500 is then flipped over and attached to a carrier substrate 530 at the first side 500a through an adhesive material 531. Thereafter, the substrate 500 is thinned from the second side 500b to expose the connectors 514 according to Operation 208. In some embodiments of the present disclosure, the bulk structure 502 of the substrate 500 is removed by thinning the substrate 500 from the second side 500b. In some embodiments of the present disclosure, the bulk structure 502 may be remained on the substrate 500 at the second side 500b, and the remained bulk structure 502 includes a thickness less than about 50 μm, as shown in FIG. 9E. In some embodiments, the dielectric layer 508 and the thinned substrate 500 including the insulator layer 504 and the semiconductor layer 506 with or without the bulk structure 502 are referred to as an insulating layer 510, and the insulating layer 510 includes a thickness less than about 50 μm. As shown in FIG. 9E, the insulating layer 510 includes a third surface 510a facing the second surface 520b of the interconnect structure 520 and a fourth surface 510b opposite to the third surface 510a.

Figure 9F:
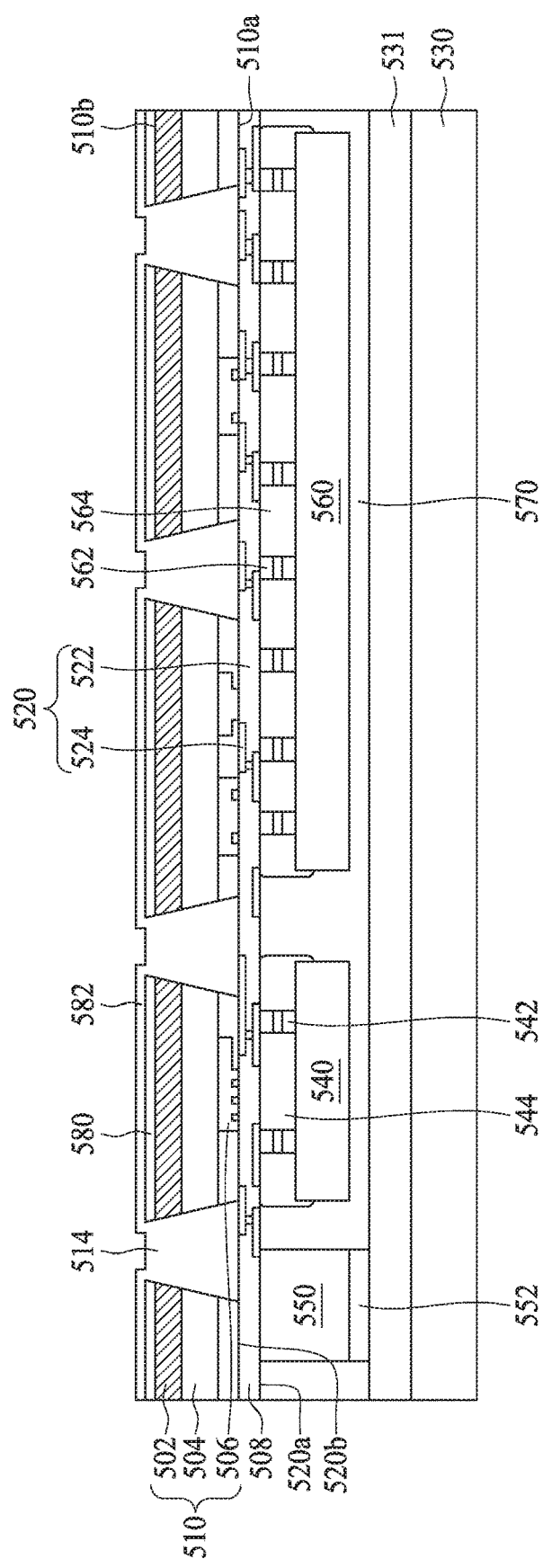

Referring to FIG. 9F, a polymer layer 580 is formed to cover portions of the insulating layer 510 and the exposed connectors 514. Subsequently, the polymer layer 580 is patterned to expose the connectors 514 from the fourth surface 510b. In some embodiments, operations shown in FIG. 9F are optional. Next, a conductive material 582 is formed over insulating layer 510, the polymer layer 580, and the exposed connectors 514. In some embodiments of the present disclosure, the conductive material 582 can include a diffusion barrier layer and a seed layer (not shown).

Figure 9G:
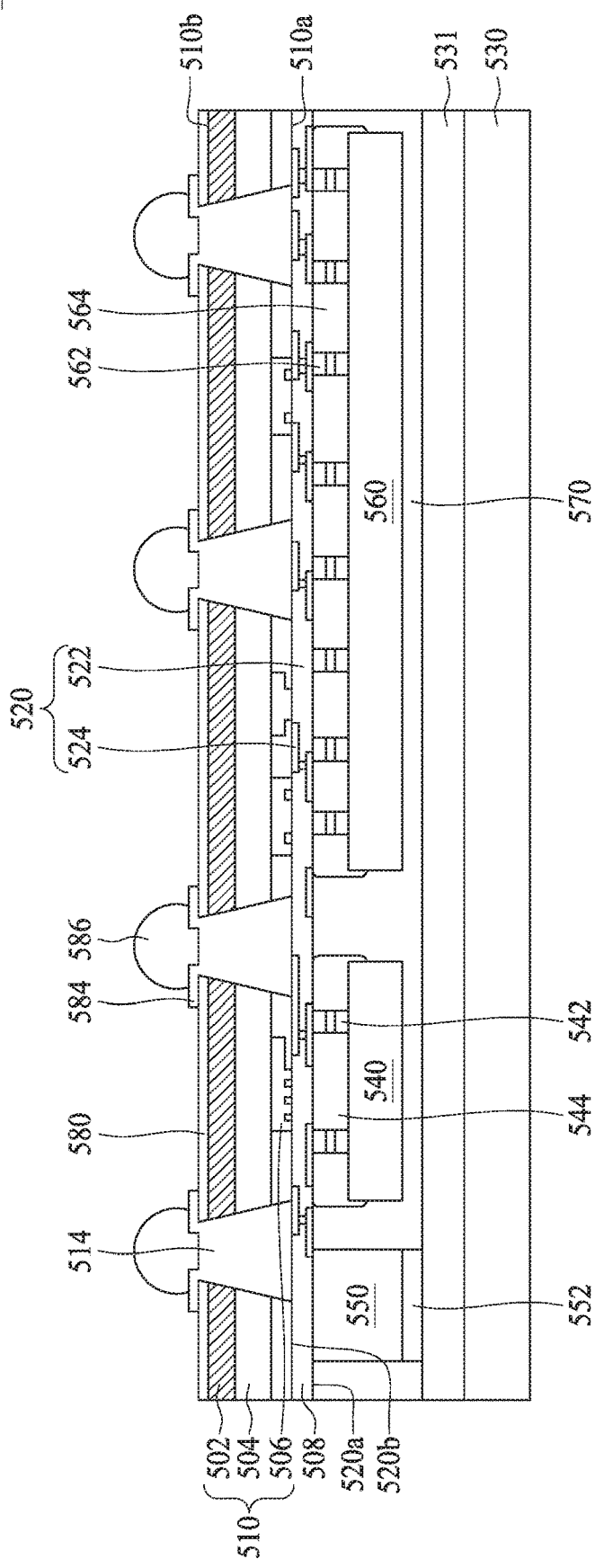

Referring to FIG. 9G, another patterned photoresist (not shown) is formed on the conductive material 582. Next, portions of the conductive material 582 are removed with the patterned photoresist serving as a mask. Accordingly, a plurality of conductive layers 584 is formed over the substrate at the second side 500b according to Operation 210. In other words, the conductive layers 584 are formed over the fourth surface 510b of the insulating layer 510. The conductive layers 584 serve as UBM layers. As shown in FIG. 9G, the conductive layers 584 are electrically coupled to the interconnect structure 520 through the connectors 514.

Still referring to FIG. 9G, the patterned photoresist is removed, and a plurality of external terminals 586 is formed in contact with the conductive layers 584. The external terminals 586 can include solder balls, metal pads, metal pillars, and/or combination thereof. Although not shown, those skilled in the art would easily realize that the adhesive material 531 and the carrier substrate 530 are then removed, and the semiconductor package 50 is flipped over. Further, the protecting layer 552 over the top surface of the spacer 550 is removed and an optical fiber or other external optical coupling device (not shown) can be affixed to the top surface of the spacer 550 through, for example but not limited to, an optical glue. As mentioned above, the optical fiber is configured to transmit the electromagnetic wave of the predetermined wavelength range. Furthermore, those skilled in the art would understand that in some embodiments, the optical fiber or other external optical coupling device can be affixed to lateral surfaces of the interconnect structure 520 and the insulating layer 510 through an optical glue as aforementioned and shown in FIG. 5. And at least one edge coupler (not shown) is formed in the optical device layer 506 in the insulating layer 510 adjacent to the optical fiber or other external optical coupling device as aforementioned and shown in FIG. 5.

According to the abovementioned embodiment, the optical chip 540 is molded in the molding compound 570, the flatness of the semiconductor package 50 is therefore improved. In some embodiments, the remained bulk structure 502 provides stronger mechanical strength. In some embodiments, the optical chip 540 can be disposed over the substrate 500 at the second side 500b. In other words, the optical chip 540 is disposed over the fourth surface 510b of the insulating layer 510. In those embodiments, the optical chip 540 is electrically coupled to the interconnect structure 520 through conductive layer 584 and the connectors 514.

In the present disclosure, the insulating layer (including the insulator layer, the optical device layer, and the dielectric layer) with or without the bulk structure serve as a TSV-less or a TSV-free structure such that the conductive layers are electrically coupled to the interconnect structure without TSVs. That is, the conductive layers provide vertical electric connections from the first side to the second side of the insulating layer. Accordingly, routing path is shortened due to elimination of the TSV signal path, which may be over 100 μm. Thus, electrical loss is reduced and electrical performance is improved. The manufacturing method for forming the semiconductor package is therefore simplified. More importantly, since the optical chip is molded within the molding compound or disposed at the side where the conductive layers and the external terminals are disposed, flatness of the semiconductor package is improved.

In some embodiments, a method for manufacturing a semiconductor package is provided. The method includes providing a substrate comprising a first side and a second side opposite to the first side, the substrate comprising at least one insulating layer at the first side, and an interconnect structure over the insulating layer: thinning the substrate from the second side; disposing at least one optical chip over the substrate: disposing a molding compound over the interconnect structure; and forming a plurality of conductive layers over the substrate at the second side. The conductive layers are electrically coupled to the interconnect structure.

In some embodiments, a semiconductor package is provided. The semiconductor package includes an interconnect structure having a first surface and a second surface opposite to the first surface, an insulating layer contacting the second surface of the interconnect structure wherein the insulating layer has a third surface facing the second surface of the interconnect structure and a fourth surface opposite to the third surface, at least one optical chip over the fourth surface of the insulating layer and electrically coupled to the interconnect structure, and a molding compound over the first surface of the interconnect structure.

In some embodiments, a semiconductor package is provided. The semiconductor package includes an interconnect structure having a first surface and a second surface opposite to the first surface, an optical chip over the second surface of the interconnect structure and electrically coupled to the interconnect structure, an optical device layer over the second surface of the interconnect structure and electrically coupled to the interconnect structure, a conductive layer disposed over the second surface of the interconnect structure and separated from the optical device layer, and an optical fiber affixed to the first surface of the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an interconnect structure comprising a first surface and a second surface opposite to the first surface, wherein the interconnect structure comprises a plurality of conductive lines, and the plurality of conductive lines comprises a first conductive line, a second conductive line and a conductive via electrically connecting the first conductive line to the second conductive line;
an insulating layer directly contacting the second surface of the interconnect structure, wherein the insulating layer comprises a third surface facing and directly contacting the second surface of the interconnect structure and a fourth surface opposite to the third surface;
a conductive layer over the second surface of the interconnect structure, wherein the conductive layer has a first boundary flush with the third surface and the conductive layer covers a portion of the fourth surface;
at least one optical chip over the fourth surface of the insulating layer and electrically coupled to the interconnect structure; and
a molding compound over the first surface of the interconnect structure.

2. The semiconductor package of claim 1, further comprising:
at least one spacer over the first surface of the interconnect structure and covered by the molding compound; and
at least one optical fiber configured to transmit electromagnetic wave of a predetermined wavelength range, the at least one optical fiber affixed to the spacer,
wherein the spacer being transparent to the electromagnetic wave of the predetermined wavelength range.

3. The semiconductor package of claim 1, further comprising an underfill material, wherein the optical chip is affixed to the insulating layer through the underfill material.

4. The semiconductor package of claim 1, further comprising:
an optical device layer electrically coupled to the interconnect structure.

5. The semiconductor package of claim 4, wherein an upper surface of the optical device layer is flush with the third surface.

6. A semiconductor package, comprising:
an interconnect structure comprising a first surface and a second surface opposite to the first surface;
an optical chip over the second surface of the interconnect structure and electrically coupled to the interconnect structure;
an optical device layer over the second surface of the interconnect structure and electrically coupled to the interconnect structure;
a conductive layer disposed over the second surface of the interconnect structure and separated from the optical device layer, wherein the conductive layer is electrically connected to the interconnect structure, and a surface of the optical device layer directly contacting with the second surface is flush with a surface of the conductive layer; and
an optical fiber affixed to the first surface of the interconnect structure.

7. The semiconductor package of claim 6, further comprising a spacer disposed between the optical fiber and the first surface of the interconnect structure.

8. The semiconductor package of claim 7, wherein the spacer is transparent to a predetermined wavelength range transmitting by the optical fiber.

9. The semiconductor package of claim 6, further comprising an external terminal at the second surface of the interconnect structure.

10. The semiconductor package of claim 6, further comprising:
a bulk structure; and
an insulator layer disposed between the bulk structure and the optical device layer.

11. The semiconductor package of claim 6, further comprising at least one device chip, wherein the device chip and the optical chip are disposed at different sides of the interconnect structure.

12. The semiconductor package of claim 11, wherein the device chip is disposed over the first surface of the interconnect structure.

13. The semiconductor package of claim 6, further comprising:
a dielectric layer over the second surface of the interconnect structure.

14. The semiconductor package of claim 6, wherein the conductive layer has a concave profile.

15. A semiconductor package, comprising:
an interconnect structure comprising a first surface and a second surface opposite to the first surface;
an insulating layer contacting the second surface of the interconnect structure, wherein the insulating layer comprises a third surface facing the second surface of the interconnect structure and a fourth surface opposite to the third surface;
an optical chip over the fourth surface of the insulating layer and electrically coupled to the interconnect structure;
a conductive layer over the second surface of the interconnect structure, wherein the conductive layer has a concave profile that defines a first boundary flush with the third surface and a second boundary higher than the fourth surface, the conductive layer covers a portion of the fourth surface of the insulating layer, and the conductive layer has a curved surface;
an external terminal in contact with the curved surface of the conductive layer; and
at least one device chip disposed over the first surface of the interconnect structure.

16. The semiconductor package of claim 15, wherein the fourth surface is between the first boundary and the second boundary.

17. The semiconductor package of claim 15, wherein at least a portion of the external terminal is between the first boundary and the second boundary.

18. The semiconductor package of claim 15, wherein the conductive layer includes an under-bump-metallurgy (UBM) layer.

19. The semiconductor package of claim 15, further comprising:
an optical device layer electrically coupled to the interconnect structure, wherein an upper surface of the optical device layer is flush with the first boundary of the conductive layer.

20. The semiconductor package of claim 19, wherein a thickness of the optical device layer is less than a thickness of the insulating layer.

* * * * *